(12) United States Patent
Ohmori

(10) Patent No.: US 6,967,978 B2
(45) Date of Patent: Nov. 22, 2005

(54) LIGHT-EMITTING ELEMENT DRIVING DEVICE

(75) Inventor: Masao Ohmori, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 69 days.

(21) Appl. No.: 10/614,509

(22) Filed: Jul. 8, 2003

(65) Prior Publication Data

US 2004/0124788 A1 Jul. 1, 2004

(30) Foreign Application Priority Data

Dec. 12, 2002 (JP) .............................. 2002-360195

(51) Int. Cl.[7] .............................. H01S 3/00; H01S 3/13
(52) U.S. Cl. .............................. 372/38.02; 372/29.011; 372/29.012; 372/29.015; 372/38.07; 315/149; 315/169.3; 315/224; 315/291; 315/307
(58) Field of Search ...................... 372/29.011, 29.012, 372/29.015, 38.02, 38.07; 315/149, 169.3, 315/224, 291, 307

(56) References Cited

U.S. PATENT DOCUMENTS

| | | | | |
|---|---|---|---|---|
| 6,304,066 | B1 * | 10/2001 | Wilcox et al. | 323/282 |
| 6,636,190 | B2 * | 10/2003 | Hirakata et al. | 345/74.1 |
| 2002/0122308 | A1 * | 9/2002 | Ikeda | 362/259 |
| 2002/0190779 | A1 * | 12/2002 | Aiba et al. | 327/530 |
| 2003/0035451 | A1 * | 2/2003 | Ishida et al. | 372/38.02 |
| 2004/0114649 | A1 * | 6/2004 | Asuri et al. | 372/38.02 |

FOREIGN PATENT DOCUMENTS

| | | | | |
|---|---|---|---|---|
| JP | 09-272223 | * 10/1997 | | B41J 2/44 |
| JP | A 9-272223 | 10/1997 | | |
| JP | 2001-36186 | * 2/2001 | | H01S 5/042 |
| JP | A 2001-36186 | 2/2001 | | |

* cited by examiner

Primary Examiner—Don Wong
Assistant Examiner—Leith Al-Nazer
(74) Attorney, Agent, or Firm—Oliff & Berridge, PLC

(57) ABSTRACT

In a semiconductor laser driving device using a voltage drive system, a drive current of a semiconductor laser is controlled by a drive current control circuit so that a light intensity of light beam emitted from the semiconductor laser is equal to a predetermined light intensity. In a drive voltage control circuit, the drive voltage applied to the semiconductor laser at the time of switching off the semiconductor laser LD is set on the basis of the detected voltage (terminal voltage).

17 Claims, 10 Drawing Sheets

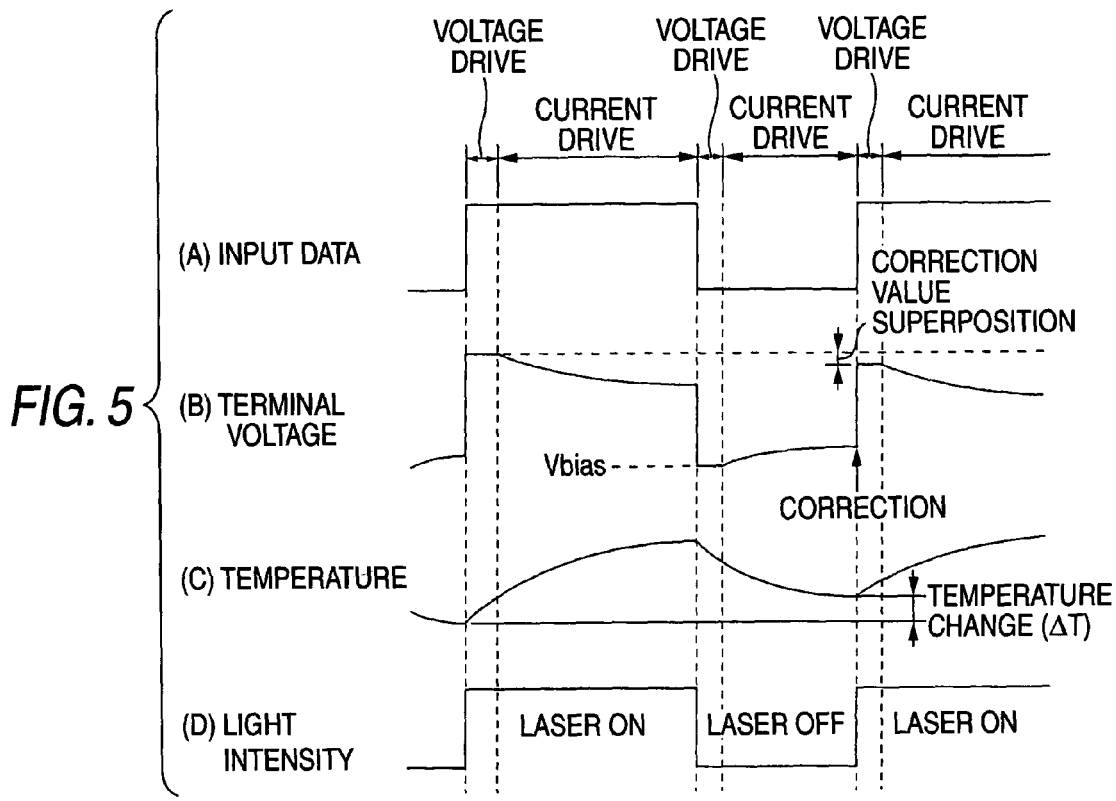
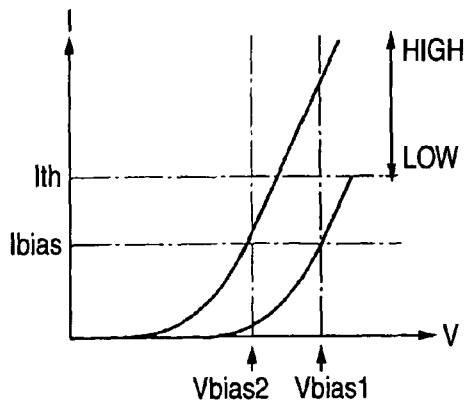

LIGHT-EMITTING ELEMENT DRIVING DEVICE

BACKGROUND OF THE INVENTION

1. Field of the Invention

The present invention relates to a light-emitting element driving device large in internal resistance (series resistance) and particularly to a light-emitting element driving device preferably used for driving a light-emitting element such as a laser element used in laser xerography.

2. Description of the Related Art

In a field of laser xerography using a laser element as a light source, the demand for higher resolution and higher speed has been intensified. The on/off control speed (hereinafter referred to as modulating speed) for controlling the laser element to be driven according to input image data is limited. When one laser light beam is used, the modulating speed cannot but be sacrificed if resolution in a sub scanning direction as well as resolution in a main scanning direction needs to be improved. Therefore, the number of laser light beams cannot but be increased if resolution in a sub scanning direction needs to be improved while the modulating speed is not changed. When, for example, four laser light beams are used, resolution both in the main scanning direction and in the sub scanning direction can be improved to twice on the assumption that the modulating speed is the same as that in the case where one laser light beam is used.

Incidentally, semiconductor lasers are roughly classified into edge emission type laser elements (hereinafter referred to as edge emission lasers) and surface emission type laser elements (hereinafter referred to as surface emission lasers). The edge emission laser has a structure in which laser light is taken out in a direction parallel to an active layer. The surface emission laser has a structure in which laser light is taken out in a direction perpendicular to an active layer. Heretofore, in laser xerography, the edge emission laser has been generally used as a laser light source.

From the point of view of increasing the number of laser light beams, the surface emission laser is however structurally preferred to the edge emission laser for the purpose of increasing the number of laser light beams because the edge emission laser is regarded as having a technical difficulty. For this reason, in the recent years, there has been advanced the development of a device using a surface emission laser capable of emitting a large number of laser light beams as a laser light source to satisfy the demand for higher resolution and higher speed in the field of laser xerography.

Semiconductor laser drive systems are roughly classified into voltage drive systems and current drive systems. Assuming now that a light-emitting element large in internal resistance such as a GaN (gallium nitride) blue laser or a single mode surface emission laser needs to be driven, then a time constant $\tau(=R \cdot C)$ decided on the basis of internal resistance R and parasitic capacitance C of wiring increases if the light-emitting element is driven by the current drive system. As a result, the leading and trailing edges of a drive current waveform become very slow so that the modulating speed is reduced. Accordingly, if the modulating speed cannot be improved greatly, there is no merit in use of the surface emission laser as a laser light source particularly in laser xerography.

From this point of view, the voltage drive system is more advantageously used as a system for driving a light-emitting element large in internal resistance than the current drive system. Heretofore, in a driving device using the voltage drive system, the light-emitting element has been driven by a voltage by an element lower in output impedance than the light-emitting element (e.g., see JP-A-2001-036186) in order to increase the modulating speed. In the voltage drive type laser driving device, feedback control is performed so that a drive voltage $V_{on}$ corresponding to the set intensity of light is applied to the semiconductor laser when the semiconductor laser is switched on, and a bias voltage $V_{bias}$ not higher than an emission threshold is applied to the semiconductor laser when the semiconductor laser is switched off.

On the other hand, in a device for driving laser elements (multi-beam laser) capable of emitting a large number of laser light beams, a bias current $I_{bias}$ flowing at the time of switching off has been heretofore set to be common to the plurality of semiconductor lasers in order to attain reduction in cost (e.g., see JP-A-09-272223). In the current drive type multi-beam laser driving device, variations in characteristic in the plurality of semiconductor lasers are considered so that the maximum current value selected from variations in current is set as the bias current $I_{bias}$ common to all the semiconductor lasers when the modulating speed is given preference, and the minimum current value selected from variations in current is set as the bias current $I_{bias}$ when prevention of abnormal lighting is given preference.

Incidentally, the drive current I of a semiconductor laser is generally given by the expression:

$$I=Is * [exp\{q(V-IR)/kT\}-1]$$

in which Is is a backward saturation current, q is an elementary electric charge (charge of an electron), V is a drive voltage, R is the internal resistance of the semiconductor laser, k is a Boltzmann constant, and T is an absolute temperature.

In a low light intensity region in which the voltage drop by the internal resistance R is low, it is obvious from the characteristic graph shown in FIG. 11 that the drive current I changes exponentially according to the drive voltage V. Accordingly, in the voltage drive type driving device, because the drive current I, that is, the intensity of emitted light changes exponentially according to the change quantity $\Delta V$ of the drive voltage V if negative feedback control is performed to control the terminal voltage when the semiconductor laser is switched on, there is a problem that the gain of negative feedback control changes widely so as to make it difficult to perform stable control.

Even when the semiconductor laser is switched off, a voltage needs to be applied to the semiconductor laser in order to quickly switch off the semiconductor laser large in internal resistance R. The switching-off of the semiconductor laser can be achieved most simply if the applied voltage is made zero. In the edge emission laser, it is however necessary to supply a bias current $I_{bias}$ near the emission threshold current to the semiconductor laser continuously for the purpose of high-speed modulation even at the time of switching off the semiconductor laser. Accordingly, a voltage corresponding to the current near the emission threshold current must be applied to the semiconductor laser when the semiconductor laser is switched off.

On the other hand, in the surface emission laser, it is unnecessary to supply the bias current $I_{bias}$ for the purpose of high-speed modulation because the volume of a resonator is small. It is however preferable that a bias voltage enough to avoid laser oscillation is applied to the semiconductor laser when the semiconductor laser is switched off because the modulating speed can be increased from the point of view of circuitry as the amplitude of the drive voltage decreases. In the bias voltage applied at the time of switching off the semiconductor laser like at the time of switching on the semiconductor laser, it is however difficult to set the drive voltage because it is obvious from FIG. 11 that the drive current changes widely as the drive voltage changes slightly.

Even if the drive voltage can be set, it is difficult to keep the bias current $I_{bias}$ proper on the basis of only the drive voltage without consideration of the current because the current varies according to temperature change when the bias voltage is set fixedly. As described above, it is preferable that, in order to quickly drive the semiconductor laser large in internal resistance, a drive voltage not higher than the threshold and near the ON voltage is applied to the semiconductor laser when the semiconductor laser is switched off. Controllability like that at the time of switching on the semiconductor laser however becomes an issue if the voltage needs to be directly controlled.

Variation in the intensity of emitted light according to temperature change is a more significant issue in the voltage drive system. The intensity of light emitted from the semiconductor laser is basically proportional to the drive current. The emission threshold current makes a large contribution to temperature compensation. Accordingly, when the semiconductor laser is driven by a current sufficiently larger than the emission threshold current, variation in the intensity of emitted light according to the temperature change is small enough to be negligible.

In the case of the voltage drive system, because the terminal voltage of the semiconductor laser has a negative temperature coefficient for the temperature when the current is kept constant, it is necessary to reduce the drive voltage according to the temperature change so that the intensity of light does not vary in spite of the temperature rise in the condition that the semiconductor laser is switched on. Conversely, in the condition that the semiconductor laser is switched off, the voltage at the time of switching on the semiconductor laser must be increased to be higher than the voltage at the time of switching off the semiconductor laser in accordance with the temperature fall so that the semiconductor laser can be switched on again with the same intensity of light because the temperature decreases at the time of switching off the semiconductor laser.

As described above, when the intensity of light is to be controlled by the voltage drive system with accuracy equal to that obtained by the current drive system, the drive voltage for the semiconductor laser must be changed according to the temperature of the semiconductor laser.

In the related-art current drive system suitable for driving a plurality of semiconductor lasers (multi-beam laser), when, for example, a bias current $I_{bias}$ to flow in common to all the semiconductor lasers at the time of switching off the semiconductor lasers is set according to the semiconductor laser having the largest emission threshold current $I_{th}$, the bias current $I_{bias}$ exceeds the emission threshold current $I_{th}$ so that some semiconductor laser may be switched on continuously if variation in characteristic of the semiconductor lasers is large. It is therefore necessary to suppress variation in characteristic of the semiconductor lasers strictly. However, if the specification for the semiconductor laser is stringent, the situation that the semiconductor laser cannot be provided may inevitably occur because of increase in cost of the semiconductor laser and reduction in yield of the semiconductor lasers according to circumstances.

On the other hand, in the related-art voltage drive system suitable for driving GaN blue edge emission lasers or single mode surface emission lasers, it is necessary to provide voltage sources according to elements because the optimal values of the bias voltages applied at the time of switching off the semiconductor lasers are different according to the elements. In this case, it is necessary to provide capacitors of high capacitance according to the elements in order to produce voltage sources with impedance kept low up to a high frequency. Particularly when the driving device is assumed to be formed as an IC, it is necessary to provide such capacitors of high capacitance in the outside of the IC because provision of the capacitors in the inside of the IC causes increase in cost. It is however a matter of course that increase in cost is brought about because the capacitors provided in the outside of the IC are required.

Therefore, when one common voltage source is to be used in the same manner as one common current value set in the current drive system, the bias voltage must be controlled according to the maximum or minimum value of the thread current. When a common voltage value is to be set according to the maximum or minimum value in the same manner as in the current drive system, it is necessary to suppress variation in characteristic of the semiconductor lasers strictly. That is, when a multi-beam laser driving device is to be formed, a drive circuit for one semiconductor laser needs to be simplified as much as possible in order to attain reduction in cost. As is obvious from the above description, the performance of the semiconductor lasers is however sacrificed when the related-art voltage drive system is used.

SUMMARY OF THE INVENTION

In order to solve the above described problem, according to one aspect of the invention, there is provided a light-emitting element driving device including: a first control unit adapted to control a drive voltage applied from a voltage source to a light-emitting element; a second control unit adapted to control a drive current supplied from a current source to said light-emitting element; a test current supply unit adapted to supply a test current to the light-emitting element when the light-emitting element is switched off; and a bias voltage setting unit adapted to set a bias voltage applied to the light-emitting element on the basis of a terminal voltage of the light-emitting element supplied with the test current from the test current supply unit when the light-emitting element is switched off, wherein, the first control unit and the second control unit controls an light intensity of a light beam emitted from the light-emitting element.

In the light-emitting element driving device configured as described above, a voltage drive and a current drive (voltage drive->current drive) are used in combination. For setting of the bias voltage, a current expected to flow in the light-emitting element at the time of switching off the light-emitting element is actually supplied as a test current from the test current supply unit to the light-emitting element in a period in which neither light intensity control nor modulation is performed. Thus, a terminal voltage of the light-emitting element supplied with the test current is detected. Then, the bias voltage setting unit sets the bias voltage applied to the light-emitting element at the time of switching off the light-emitting element on the basis of the detected voltage. Accordingly, the bias voltage applied to the light-emitting element at the time of switching off the light-emitting element can be easily set to be a target value compared with the related art in which it was difficult to control the current because the current varied widely according to slight voltage change.

BRIEF DESCRIPTION OF THE DRAWINGS

The above objects and advantages of the present invention will become more apparent by describing in detail preferred exemplary embodiments thereof with reference to the accompanying drawings, wherein:

FIG. 5 is a time chart of waveforms for explaining a switching control operation between voltage drive and current drive;

FIG. 6 is a graph of voltage-current characteristic of a semiconductor laser showing a state in which a bias current $I_{bias}$ varies according to temperature change;

DETAILED DESCRIPTION OF THE PREFERRED EMBODIMENTS

Embodiments of the invention will be described below in detail with reference to the drawings.

First Embodiment

Figure 1:
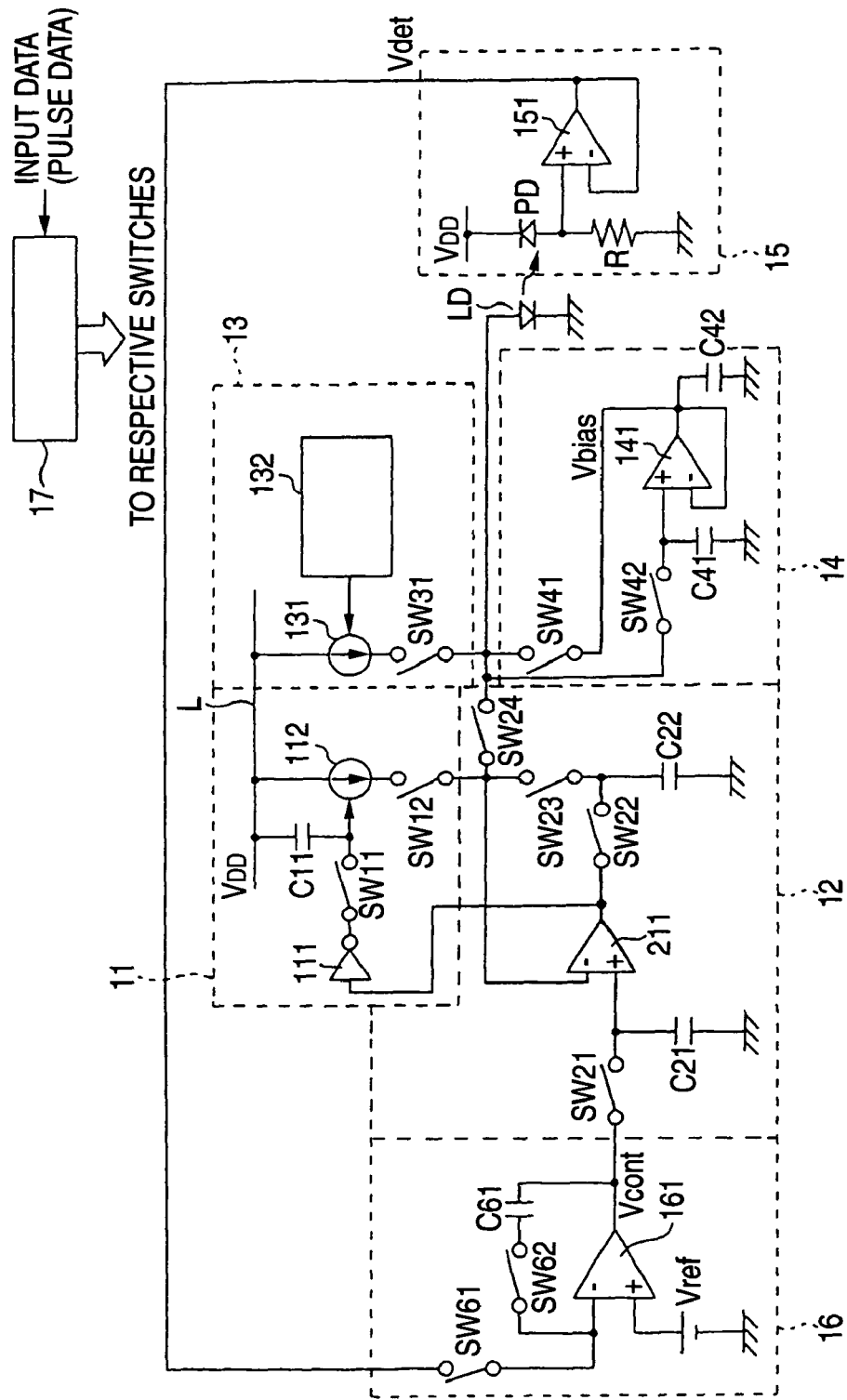
FIG. 1 is a circuit diagram showing an example of configuration of a light-emitting element driving device according to a first embodiment of the invention.

FIG. 1 is a circuit diagram showing an example of configuration of a light-emitting element driving device according to a first embodiment of the invention. In the first embodiment, for example, a semiconductor laser, particularly, a GaN blue laser or a single mode surface emission laser high in internal resistance is used as a light-emitting element to be driven. These are generically referred to as semiconductor laser LD. For example, the semiconductor laser LD has a cathode grounded, and an anode provided as a drive end.

The light-emitting element driving device according to the first embodiment includes: a drive current control circuit 11 for controlling a drive current of the semiconductor laser LD to make the intensity of light emitted from the semiconductor laser LD coincident with set light intensity; a drive voltage control circuit 12 for controlling a drive voltage applied to the semiconductor laser LD at the time of switching on the semiconductor laser LD on the basis of a terminal voltage of the semiconductor laser LD when the light intensity is controlled to be equal to the set light intensity by the drive current control circuit 11; a test current supply circuit 13 for supplying a test current to the semiconductor laser LD; a bias voltage setting circuit 14 for setting a bias voltage applied to the semiconductor laser LD at the time of switching off the semiconductor laser LD on the basis of the terminal voltage of the semiconductor laser LD supplied with the test current from the test current supply circuit 13; a light intensity detection circuit 15 for detecting the intensity of light emitted from the semiconductor laser LD; and an error detection circuit 16 for detecting an error voltage between a voltage $V_{det}$ detected by the light intensity detection circuit 15 and a reference voltage $V_{ref}$ and outputting the error voltage as a light intensity control voltage $V_{cont}$.

The drive current control circuit 11 includes an inverter 111, a current source 112, a capacitor C11, and switches SW11 and SW12. The light intensity control voltage $V_{cont}$ is supplied from the error detection circuit 16 to the drive current control circuit 11 through the drive voltage control circuit 12. The light intensity control voltage $V_{cont}$ passes through the inverter 111 and the switch SW11 and serves as a control input of the current source 112. The capacitor C11 is connected between a power-supply line L of a power-supply voltage VDD and an output terminal of the switch SW11. One end of the current source 112 is connected to the power-supply line L. One end of the switch SW12 is connected to the other end of the current source 112. The other end of the switch SW12 is connected to one end of a switch SW24.

In the drive current control circuit 11 configured as described above, the light intensity control voltage $V_{cont}$ supplied from the error detection circuit 16 through the drive voltage control circuit 12 is input as a control voltage of the current source 112 via the inverter 111 and the switch SW11 to control the drive current supplied from the current source 112 to the semiconductor laser LD. As a result, in the drive current control circuit 11, the drive current of the semiconductor laser LD is controlled so that the intensity of light emitted from the semiconductor laser LD coincides with set light intensity (target light intensity) decided on the basis of the reference voltage $V_{ref}$ of the error detection circuit 16.

The drive voltage control circuit 12 includes four switches SW21 to SW24, two capacitors C21 and C22, and an operational amplifier 211. One end of the switch SW21 is connected to an output side of the error detection circuit 16. The other end of the switch SW21 is connected to a non-inverted input terminal of the operational amplifier 211. The capacitor C21 is connected between the other end of the switch SW21 and the ground to thereby operate with the switch SW21 to form a sample-and-hold circuit. The operational amplifier 211 has the non-inverted (+) input terminal connected to the other end of the switch SW21.

The switch SW22 has one end connected to an output terminal of the operational amplifier 211. The capacitor C22 is connected between the other end of the switch SW22 and the ground to thereby operate with the switch SW22 to form a sample-and-hold circuit. The switch SW23 has one end connected to the other end of the switch SW22. The switch SW24 has one end connected to the other end of the switch SW23, and the other end connected to an anode of the semiconductor laser LD. An inverted (−) input terminal of the operational amplifier 211 is connected to a common junction between the other end of the switch SW23 and one end of the switch SW24.

In the drive voltage control circuit 12 configured as described above, the switches SW22 and SW23 are turned off and the switches SW21 and SW24 are turned on when the drive current of the semiconductor laser LD is controlled, that is, when light intensity is controlled. When the semiconductor laser LD is switched off, the switches SW22 and SW23 are turned on and the switches SW21 and SW24 are turned off. As a result, the operational amplifier 211 forms a voltage follower buffer, so that the output voltage of the operational amplifier 211 is held by the capacitor C22. The hold voltage is a terminal voltage of the semiconductor laser LD when the light intensity has a set value. When the semiconductor laser LD is switched on, the switches SW23 and SW24 are turned on so that the hold voltage of the capacitor C22 is applied as a drive voltage to the semiconductor laser LD through the switches SW23 and SW24.

The test current supply circuit 13 includes a current source 131, a switch SW31, and a test current setting portion 132. The current source 131 has one end connected to the power-supply line L. The switch SW31 has one end connected to the other end of the current source 131, and the other end connected to the anode of the semiconductor laser LD. The test current setting portion 132 sets a current of the current source 131, that is, a test current.

In the test current setting circuit 13 configured as described above, in order to decide the bias voltage $V_{bias}$ applied to the semiconductor laser LD at the time of switching off the semiconductor laser LD, the switch SW31 is turned on at the time of switching off the semiconductor laser LD in a period in which neither light intensity control nor modulation is performed as will be described later. As a result, the test current set by the test current setting portion 132 is supplied from the current source 131 to the semiconductor laser LD through the switch SW31. In the test current setting portion 132, a current corresponding to the bias voltage $V_{bias}$ to be applied to the semiconductor laser LD at the time of switching off the semiconductor laser LD is set as the test current. Generally, a voltage lower than the oscillation threshold voltage of the semiconductor laser LD, preferably a voltage slightly lower than the oscillation threshold voltage of the semiconductor laser LD is set as the bias voltage $V_{bias}$ in order to increase the modulating speed.

The bias voltage setting circuit 14 includes switches SW41 and SW42, capacitors C41 and C42, and a voltage follower buffer 141. The switch SW41 has one end connected to the anode of the semiconductor laser LD. The switch SW42 has one end connected to the anode of the semiconductor laser LD, and the other end connected to a non-inverted input terminal of the buffer 141. The capacitor C41 is connected between the other end of the switch SW42 and the ground to thereby operate with the switch SW42 to form a sample-and-hold circuit. An output terminal of the buffer 141 is directly connected to an inverted input terminal of the buffer 141 and further connected to the other end of the switch SW41. The capacitor C42 is connected between the output terminal of the buffer 141 and the ground.

In the bias voltage setting circuit 14 configured as described above, the switch SW42 is turned on when the test current is supplied from the test current supply circuit 13 to the semiconductor laser LD, and further turned off. As a result, the terminal voltage of the semiconductor laser LD is held by the capacitor C41 while the test current flows in the semiconductor laser LD. The hold voltage is held by the capacitor C42 through the voltage follower buffer 141. When the switch SW41 is turned on at the time of switching off the semiconductor laser LD, the hold voltage is applied as a bias voltage $V_{bias}$ to the semiconductor laser LD.

For example, the light intensity detection circuit 15 uses a photo diode PD as a photo detector for detecting laser light emitted from the semiconductor laser LD. The photo diode PD has a cathode connected to the power-supply line L. One end of a resistor R is connected to an anode of the photo diode PD. The other end of the resistor R is grounded. Assuming now that the photo diode PD detects laser light emitted from the semiconductor laser LD, then a current corresponding to the intensity of the light flows in the resistor R. As a result, a detection voltage corresponding to the intensity of light emitted from the semiconductor laser L is generated between the opposite ends of the resistor R.

The detection voltage is supplied to a non-inverted input terminal of an amplifier 151. An output terminal of the amplifier 151 is directly connected to an inverted input terminal of the amplifier 151. The output voltage of the amplifier 151, that is, the detection voltage of the light intensity detection circuit 15 is supplied to the drive current control circuit 11. That is, a feedback system is formed so that the detection voltage of the light intensity detection circuit 15 is fed back to the drive current control circuit 11 to thereby perform automatic power control (hereinafter referred to as APC) for controlling the laser power of the semiconductor laser LD to a value decided by the reference voltage $V_{ref}$.

The error detection circuit 16 includes a differential amplifier 161, switches SW61 and SW62, and a capacitor C61. The differential amplifier 161 has a non-inverted input terminal to which the reference voltage $V_{ref}$ is input, and an inverted input terminal to which the detection voltage $V_{det}$ supplied from the light intensity detection circuit 15 via the switch 61 is input. Incidentally, the reference voltage $V_{ref}$ is set by a voltage value corresponding to the target light intensity (laser power) of the semiconductor laser LD. The switch SW62 and the capacitor C61 are series-connected between the inverted input terminal of the differential amplifier 161 and an output terminal of the differential amplifier 161.

In the error detection circuit 16 configured as described above, the differential amplifier 161 compares the detection voltage $V_{det}$ corresponding to the light intensity of the semiconductor laser LD detected by the light intensity detection circuit 15, with the reference voltage $V_{ref}$ set according to the target light intensity of the semiconductor laser LD and outputs the difference (error voltage) between the two voltages as a light intensity control voltage $V_{cont}$.

Incidentally, the switches SW11 and SW12 of the drive current control circuit 11, the switches SW21 to SW24 of the drive voltage control circuit 12, the switch SW31 of the test current supply circuit 13, the switches SW41 and SW42 of the bias voltage setting circuit 14 and the switches SW61 and SW62 of the error detection circuit 16 are controlled to be turned on/off by the control circuit 17. In the semiconductor laser driving device according to the first embodiment, the control circuit 17 is configured so that voltage drive control is always performed at the time of turning on/off the semiconductor laser LD in a modulation period in which the semiconductor laser LD is repeatedly driven to be turned on/off according to the input data (pulse data).

The circuit-operation of the light-emitting element driving device, that is, the semiconductor laser driving device according to the fist embodiment configured as described above will be described below.

When powered on, the device gets into an APC mode. In the APC mode, the switches SW61 and SW62 in the error detection circuit 16 are turned on, the switches SW21 and SW24 in the drive voltage control circuit 12 are turned on, and the switches SW11 and SW12 in the drive current control circuit 11 are turned on. As a result, the current of the current source 112 flows as a drive current in the semiconductor laser LD via the switches SW12 and SW24, so that the semiconductor laser LD is switched on.

When the semiconductor laser LD is switched on, the photo diode PD of the light intensity detection circuit 15 receives laser light emitted from the semiconductor laser LD. As a result, a current corresponding to the intensity of the light flows in the photo diode PD. The current flowing in the photo diode PD is converted into a voltage by the resistor R. The voltage is amplified by the amplifier 151, so that the amplified voltage is output as a detection voltage $V_{det}$ corresponding to the laser power (light intensity) of the semiconductor laser LD.

The detection voltage $V_{det}$ is supplied to the error detection circuit 16 so as be provided as an inverted input of the differential amplifier 161 via the switch SW61. The differential amplifier 161 amplifies the difference (error voltage) between the detection voltage $V_{det}$ and the reference voltage $V_{ref}$ and outputs the error voltage as a light intensity control voltage $V_{cont}$. The light intensity control voltage $V_{cont}$ is supplied as a control voltage to the current source 112 via the switch SW21, the operational amplifier 211., the inverter 111 and the switch SW11. The drive current of the semiconductor laser LD is controlled on the basis of the light intensity control voltage $V_{cont}$, so that the light intensity of the semiconductor laser LD is controlled.

The control of the negative feedback loop according to the detection voltage $V_{det}$ of the light intensity detection circuit 15 by the error detection circuit 16 and the drive current control circuit 11 converges the detection voltage $V_{det}$ so that the detection voltage $V_{det}$ finally coincides with the reference voltage $V_{ref}$ set according to the set light intensity. As a result, the light intensity of the semiconductor laser LD becomes equal to the set light intensity. The aforementioned series of feedback control is APC (automatic power control). The APC operation may be performed once or may be repeated by a plurality of times.

After completion of the APC operation, the switch SW11 of the drive current control circuit 11 and the switch SW62 of the error detection circuit 16 are turned off and the switches SW22 and SW23 of the drive voltage control circuit 12 which were turned off at the time of APC are turned on. As a result, the output voltage of the differential amplifier 161 just before that, that is, the light intensity control voltage $V_{cont}$ at the time of controlling the light intensity of the semiconductor laser LD to the set light intensity is held by the capacitors C61 and C21. Further, the control voltage for setting the drive current at the time of controlling the light intensity of the semiconductor laser LD to the set light intensity is held by the capacitor C11. Further, the capacitor C22 of the drive voltage control circuit 12 is charged with the light intensity control voltage $V_{cont}$ held by the capacitor C21. On this occasion, the voltage held by the capacitor C11 forms a control voltage for setting the drive current at the time of driving the semiconductor laser LD to emit light with the set light intensity while the voltages held by the capacitors C21 and C22 form a terminal voltage of the semiconductor laser LD having the set light intensity.

When the APC operation is completed, the device gets into a modulation mode in which driving the semiconductor laser LD is controlled to be turned on/off according to the input data. In the modulation mode, the switch SW24 of the drive voltage control circuit 12 is turned on when the semiconductor laser LD is switched off. The hold voltage of the capacitor C22, that is, the terminal voltage of the semiconductor laser LD having the set light intensity is applied to the anode of the semiconductor laser LD through the switches SW23 and SW24. Further, because the switch SW12 of the drive current control circuit 11 is turned on, the drive current is supplied from the current source 112 to the semiconductor laser LD through the switch SW12.

In the case of an edge emission laser, a bias current $I_{bias}$ near the emission threshold current needs to flow in the semiconductor laser LD continuously for obtaining high-speed modulation even at the time of switching off the semiconductor laser LD. Accordingly, a bias voltage $V_{bias}$ corresponding to the current near the emission threshold current needs to be applied to the semiconductor laser LD when the semiconductor laser LD is switched off. In the case of a semiconductor laser high in internal resistance, the amplitude of the drive voltage needs to be reduced at the time of switching on/off the semiconductor laser. Accordingly, such a voltage that the semiconductor laser is not switched on is preferably applied to the semiconductor laser.

In the first embodiment, therefore, the test current supply circuit 13 and the bias voltage setting circuit 14 operate so that the bias voltage $V_{bias}$ applied to the semiconductor laser LD at the time of switching off the semiconductor laser LD is set as follows. That is, the switch SW31 is turned on at the switching off the semiconductor laser LD in a period in which neither APC nor modulation is performed. As a result, the current to flow in the semiconductor laser LD at the time of switching off the semiconductor laser LD is supplied as a test current from the current source 131 to the semiconductor laser LD through the switch SW31 by the test current setting portion 132.

On the other hand, in the bias voltage setting circuit 14, the switch SW42 is turned on when the test current is supplied from the test current supply circuit 13 to the semiconductor laser LD, and then turned off. As a result, the terminal voltage of the semiconductor laser LD supplied with the test current is held by the capacitor C41. Then, the hold voltage of the capacitor C41 is held by the capacitor C42 through the buffer 141. When the switch SW41 is then turned on at the time of switching off the semiconductor laser LD, the hold voltage of the capacitor C42 is applied as a bias voltage $V_{bias}$ to the semiconductor laser LD via the switch SW41.

As described above, in the semiconductor laser LD driving device according to the first embodiment, that is, in the voltage drive type driving device, in order to set the bias voltage $V_{bias}$, the current to flow in the semiconductor laser LD at the time of switching off the semiconductor laser LD is actually supplied as a test current to the semiconductor laser LD in a period in which neither APC nor modulation is performed. The terminal voltage of the semiconductor laser LD supplied with the test current is detected. The bias voltage $V_{bias}$ to be applied to the semiconductor laser LD at the time of switching off the semiconductor laser LD is set on the basis of the detected voltage. Accordingly, the bias current to flow in the semiconductor laser LD at the time of switching off the semiconductor laser LD can be easily set at the target value compared with the related art in which the current varied widely according to the slight change of the voltage so that it was difficult to control the current. That is, when the current is controlled to obtain the drive voltage so that the voltage is driven on the basis of the voltage value of the drive voltage, the voltage drive can be made with controllability equal to that of the current drive.

Figure 2:
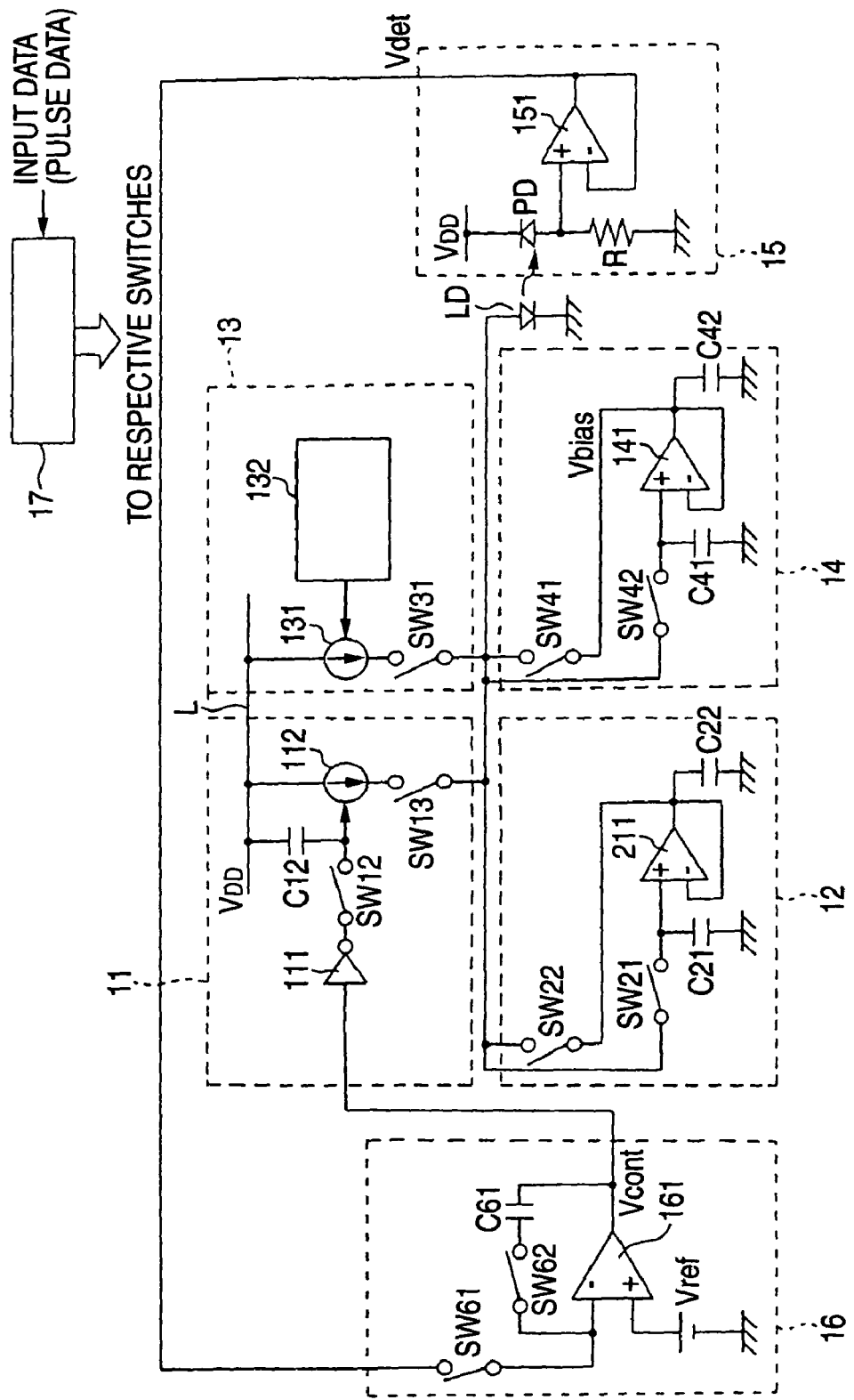
FIG. 2 is a circuit diagram showing an example of configuration of important part of the light-emitting element driving device according to a modification of the first embodiment.

FIG. 2 is a circuit diagram showing an example of configuration of import part of the light-emitting element driving device, that is, the semiconductor laser driving device according to a first modification of the first embodiment. In FIG. 2, parts the same as those in FIG. 1 are denoted by the same reference numerals as those in FIG. 1. In FIG. 2, the test current supply circuit 13, the bias voltage setting circuit 14, the light intensity detection circuit 15 and the error detection circuit 16 are the same in configuration and operation as those in FIG. 1.

The semiconductor laser driving device according to the first modification of the first embodiment has a feature in that the output voltage of the error detection circuit 16, that is, the light intensity control voltage $V_{cont}$ is directly input to an analog inverter 111 in the drive current control circuit 11 so that the drive current of the current source 112 is directly controlled on the basis of the light intensity control voltage $V_{cont}$. The drive voltage control circuit 12 includes switches SW21 and SW22, capacitors C21 and C22, and a voltage follower buffer 211. The drive voltage control circuit 12 has the same circuit configuration as the bias voltage setting circuit 14.

In the semiconductor laser driving device according to the first modification of the first embodiment, the drive current is supplied from the current source 112 to the semiconductor laser LD at the time of APC because the switches SW12 and SW13 of the drive current control circuit 11 are turned on. On this occasion, the reference voltage and a light output voltage corresponding to the intensity of emitted light are input to non-inverted input and inverted input terminals of the operational amplifier 161 of the error detection circuit 16. As a result, a voltage proportional to the difference between the two voltages is input as a drive current control voltage to the current source 112 through the analog inverter 111, so that the current is set to obtain the set light intensity.

In the drive voltage control circuit 12, because the switch SW21 is turned on and the switch SW22 is turned off, the terminal voltage of the semiconductor laser LD is held by the capacitor C21. Accordingly, the voltage follower buffer 211 operates so that the capacitor C22 is charged with the voltage held by the capacitor C21.

When APC is completed, the switches SW12 and SW13 of the drive current control circuit 11 and the switch SW21 of the drive voltage control circuit 12 are switched off so that the voltage of the capacitor C12 serves as a control voltage for setting the drive current to make the semiconductor laser LD emit light with the set light intensity. Accordingly, the voltage held by the capacitors C21 and C22 serves as a terminal voltage of the semiconductor laser LD for obtaining the set light intensity.

As described above, in the semiconductor laser LD driving device according to the first modification of the first embodiment, that is, in the voltage drive type driving device, the drive current of the semiconductor laser LD is controlled to make the light intensity of the semiconductor laser LD equal to the set light intensity. The terminal voltage of the semiconductor laser LD is detected when the intensity of light emitted from the semiconductor laser LD is equal to the set light intensity. The drive voltage applied to the semiconductor laser LD at the time of switching on the semiconductor laser LD is set on the basis of the detected voltage (terminal voltage). Accordingly, because the drive current of the semiconductor laser LD is substantially proportional to the light intensity, the gain of the negative feedback loop for APC can be kept constant. Accordingly, stable control can be performed compared with the related-art case where negative feedback is performed by controlling the terminal voltage at the time of switching on the semiconductor laser LD.

Figure 3:
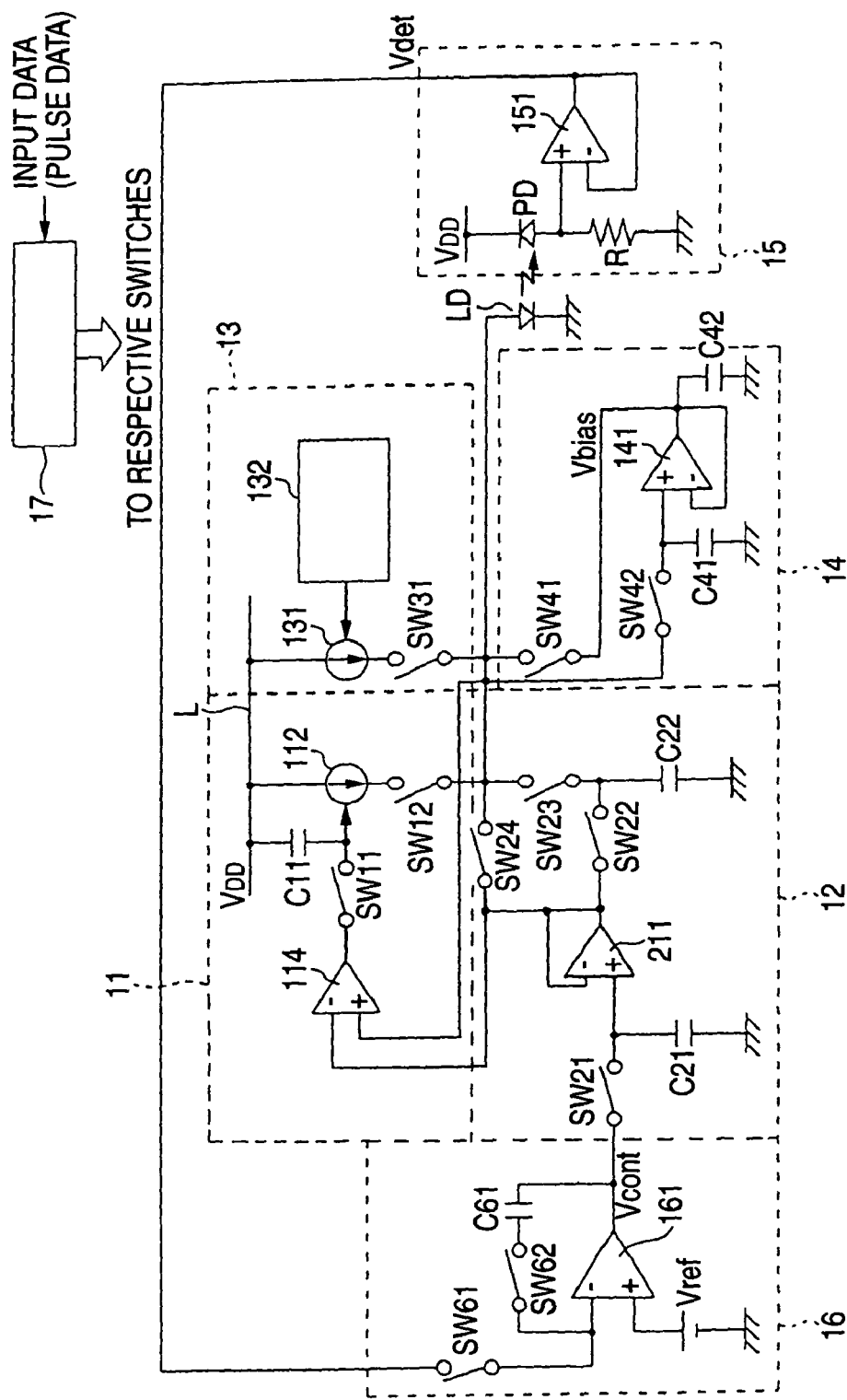
FIG. 3 is a circuit diagram showing an example of configuration of important part of the light-emitting element driving device according to another modification of the first embodiment.

FIG. 3 is a circuit diagram showing an example of configuration of important part of the light-emitting element driving device, that is, the semiconductor laser driving device according to a second modification of the first embodiment. In FIG. 3, parts the same as those in FIG. 1 are denoted by the same reference numerals as those in FIG. 1. In FIG. 3, the test current supply circuit 13, the bias voltage setting circuit 14, the light intensity detection circuit 15 and the error detection circuit 16 are the same in configuration and operation as those in FIG. 1.

In the semiconductor laser driving device according to the second modification of the first embodiment, the drive voltage control circuit 12 includes four switches SW21, SW22, SW23 and SW24, capacitors C21 and C22, and a buffer 211. The switch SW21 has one end connected to an output side of the error detection circuit 16, and the other end connected to a non-inverted input terminal of the buffer 211. The capacitor C21 is connected between the other end of the switch SW21 and the ground to thereby operate with the switch SW21 to form a sample-and-hold circuit. The buffer 211 is made of an operational amplifier having an output terminal and an inverted input terminal connected to each other.

The switch SW22 has one end connected to the output terminal of the buffer 211. The capacitor C22 is connected between the other end of the switch SW22 and the ground to thereby operate with the switch SW22 to form a sample-and-hold circuit. The switch SW23 has one end connected to the other end of the switch SW22, and the other end connected to an anode of the semiconductor laser LD. The switch SW24 has one end connected to the other end of the switch SW23 and to the anode of the semiconductor laser LD, and the other end connected to the output terminal of the buffer 211.

In the drive voltage control circuit 12 configured as described above, at the time of APC, the switches SW22 and SW23 are turned off and the switches SW21 and SW24 are turned on. As a result, the output voltage of the error detection circuit 16, that is, the light intensity control voltage $V_{cont}$ is applied to the semiconductor laser LD via the switch SW21, the buffer 211 and the switch SW24 so that a feedback loop is formed.

When the semiconductor laser LD is switched off, the switch SW22 is turned on and the switches SW21, SW23 and SW24 are turned off. As a result, the output voltage of the buffer 211, that is, the terminal voltage of the semiconductor laser LD at the time of completion of the light intensity control is held by the capacitor C22. When the switch SW23 is then turned on at the time of switching on the semiconductor laser LD, the hold voltage of the capacitor C22 is applied as a drive voltage to the semiconductor laser LD through the switch SW23.

The drive current control circuit 11 includes an operational amplifier 114, switches SW11 and SW12, a capacitor C11, and a current source 112. The operational amplifier 114 has an inverted input terminal connected to the one end of the switch SW24 and to the output terminal of the buffer 211, and a non-inverted input terminal connected to the anode side of the semiconductor laser LD. The capacitor C11 is connected between a power-supply line L of a power-supply voltage VDD and an output side terminal of the switch SW11. The current source 112 has one end connected to the power-supply line L. The switch SW12 has one end connected to the other end of the current source 112, and the other end connected to the anode side of the semiconductor laser LD.

In the drive current control circuit 11 configured as described above, the switches SW11 and SW12 are turned on at timing independent of both light intensity control and modulation. On this occasion, the switch SW24 of the drive voltage control circuit 12 is turned off. As a result, the drive current control circuit 11 supplies the drive current to the semiconductor laser LD so that the terminal voltage of the semiconductor laser LD coincides with the output voltage of the buffer 211 (i.e., the voltage of the capacitor C21 for sampling and holding the terminal voltage at the time of light intensity control). Then, the switch SW11 is turned off so that the control voltage for supplying the drive current is held by the capacitor C11. When modulation lighting is performed, the switch SW12 turned on so that a compensating current for compensating the current driving capacity of the voltage source is supplied to the semiconductor laser LD.

As described above, in the semiconductor laser LD driving device according to the second modification of the first embodiment, the voltage source of low output impedance is controlled to perform voltage drive control so that the influence of a time constant decided on the basis of the internal resistance and capacitance of the light-emitting element can be reduced compared with the case of current drive control though a long time is required for convergence of light intensity into a target value because of the influence of the time constant if the current source is controlled to perform current drive control at the time of light intensity control when the internal resistance of the semiconductor laser LD is very high. Accordingly, the time required for convergence in light intensity control can be shortened.

Generally, the temperature of a light-emitting element such as a semiconductor laser varies according to the drive current. In the case of constant voltage drive, variation in current, that is, variation in light intensity is caused by the temperature change of the semiconductor laser when the semiconductor laser is driven. Although such variation in light intensity can be neglected in the case of ordinary drive control, it is preferable that the variation in light intensity caused by the temperature change is eliminated in order to achieve more excellent drive control.

The light intensity of the semiconductor laser is basically proportional to the drive current. The emission threshold current makes a great contribution to the temperature. Accordingly, the drive voltage of the semiconductor laser can be controlled on the basis of detection of the temperature change of the semiconductor laser so that constant light intensity can be always provided. Various methods have been heretofore proposed as the method for detecting the temperature of the semiconductor laser. One of the methods for detecting the temperature of the semiconductor most directly is a method in which the laser temperature is predicted on the basis of variation in the terminal voltage of the semiconductor laser.

Particularly when the semiconductor laser is in a constant current state, the temperature of the semiconductor laser can be detected accurately because the terminal voltage is proportional to the temperature. Therefore, when control is shifted from constant voltage drive to constant current drive after the semiconductor laser is driven with a constant voltage at the leading edge/trailing edge for switching on/off the semiconductor laser, the temperature can be detected on the basis of the change of the terminal voltage of the semiconductor laser in the period of constant current drive.

Upon such circumstances, the voltage drive system and the current drive system may be used in combination so that a function for correcting the variation in light intensity caused by the temperature change ($\Delta T$) in the period of constant current drive can be given to the light-emitting element driving device as will be described as a second embodiment of the invention.

Second Embodiment

Figure 4:
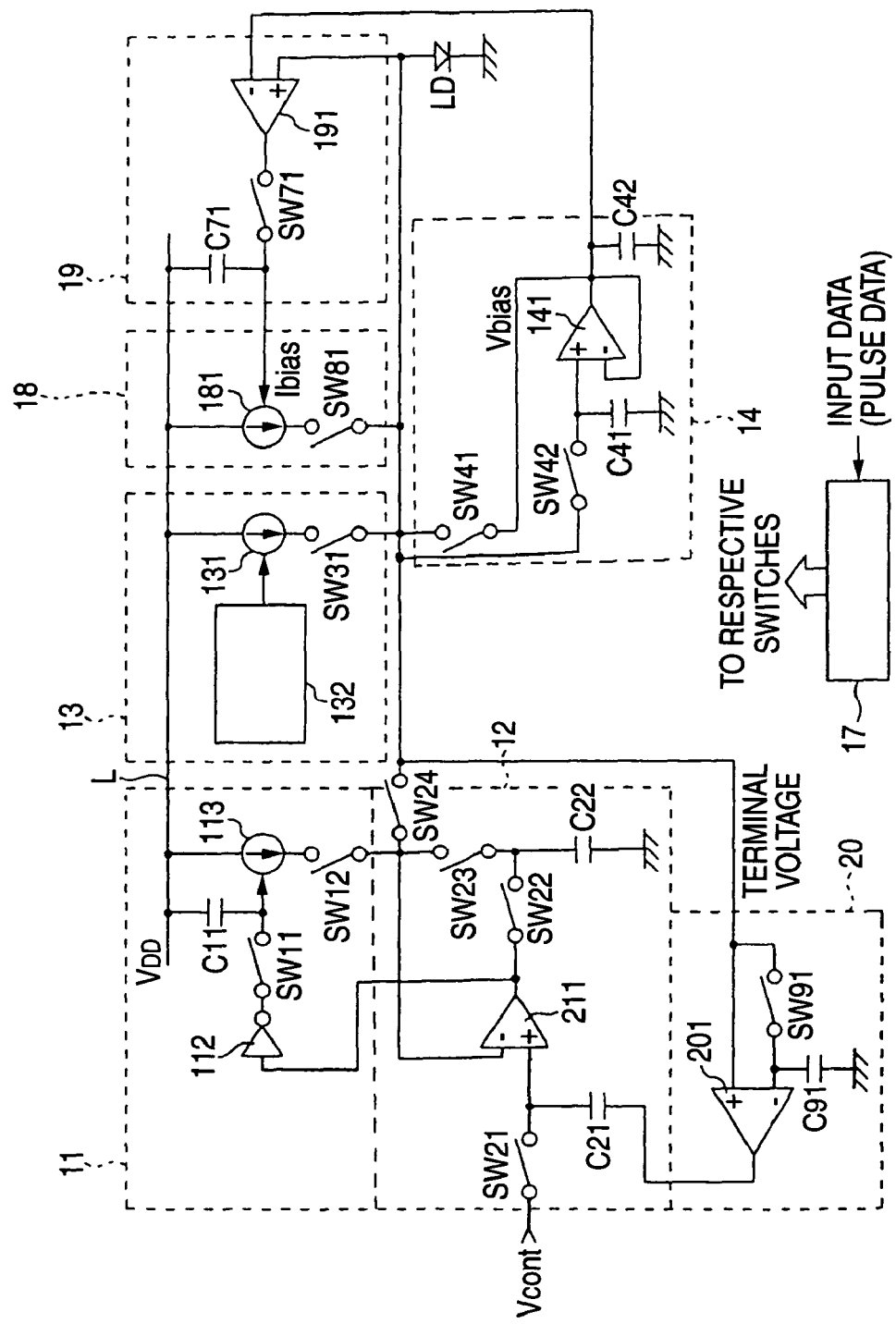
FIG. 4 is a circuit diagram showing an example of configuration of the light-emitting element driving device according to a second embodiment of the invention.

FIG. 4 is a circuit diagram showing an example of configuration of the light-emitting element driving device according to a second embodiment of the invention. In FIG. 4, parts the same as those in FIG. 1 are denoted by the same reference numerals as those in FIG. 1. In FIG. 4, the light intensity detection circuit 15 and the error detection circuit 16 are dispensed with. The light-emitting element driving device according to the second embodiment, that is, the semiconductor laser driving device is configured so that a correction circuit for correcting variation in light intensity caused by the temperature change ($\Delta T$) is provided as well as the voltage drive system and the current drive system are used in combination.

To achieve the current drive, there are provided a bias current supply circuit 18 for supplying a bias current $I_{bias}$ to the semiconductor laser LD at the time of switching off the semiconductor laser LD and a bias current setting portion 19 for setting the bias current $I_{bias}$. The bias current supply circuit 18 includes a current source 181, and a switch SW81. The current source 181 has one end connected to the power-supply line L. The switch SW81 has one end connected to the other end of the current source. 181, and the other end connected to the anode of the semiconductor laser LD.

The bias current setting portion 19 sets the bias current $I_{bias}$ supplied to the semiconductor laser LD at the time of switching off the semiconductor laser LD on the basis of the bias voltage $V_{bias}$ set based on the terminal voltage of the semiconductor laser LD supplied with the test current in the bias voltage setting circuit 14. Specifically, for example, the bias current setting portion 19 includes a differential amplifier 191, a switch SW71, and a capacitor C71.

The differential amplifier 191 receives the bias voltage $V_{bias}$ set by the bias voltage setting circuit 14 and the terminal voltage of the semiconductor laser LD as an inverted input and a non-inverted input respectively and sets the current of the current source 181, that is, the bias current $I_{bias}$ on the basis of such negative feedback control that the terminal voltage of the semiconductor laser LD at the time of switching off the semiconductor laser LD coincides with the bias voltage $V_{bias}$ set by the bias voltage setting circuit 14. The switch SW71 and the capacitor C71 form a sample-and-hold circuit. The output of the differential amplifier 191, that is, a voltage value corresponding to the bias current $I_{bias}$ to be set is held by the capacitor C71. When the configuration of negative feedback control is used, control can be performed by simple configuration so that the terminal voltage of the semiconductor laser LD at the time of switching off the semiconductor laser LD coincides with the set bias voltage $V_{bias}$.

Further, a correction circuit 20 for correcting variation in light intensity caused by the temperature change ($\Delta T$) includes an error amplifier 201 with a gain of 1, a switch SW91, and a capacitor C91. The error amplifier 201 has a non-inverted input terminal supplied with the terminal voltage of the semiconductor laser LD. Assuming now that a constant current flows in the semiconductor laser LD, then the terminal voltage varies according to the temperature of the semiconductor laser LD. Specifically, the terminal voltage decreases as the temperature of the element increases. Accordingly, when the terminal voltage of the semiconductor laser LD is detected, the temperature of the semiconductor laser LD can be monitored.

Incidentally, the technique for monitoring the temperature of the semiconductor laser LD is not limited to the technique of detecting the terminal voltage of the semiconductor laser LD. For example, a technique using the detection output of a temperature detection unit such as a thermistor disposed near the semiconductor laser LD may be used. The technique of detecting the terminal voltage of the semiconductor laser LD has however an advantage in that the temperature of the semiconductor laser LD can be monitored more speedily and more accurately.

The switch SW91 and the capacitor C91 form a sample-and-hold circuit. That is, the terminal voltage of the semiconductor laser LD is sampled by the switch SW91, so that the sampled voltage is held by the capacitor C91. The hold voltage of the capacitor C91 is used as a reference voltage given to the inverted input terminal of the error amplifier 201. An output terminal of the error amplifier 201 is connected to one end (open end) of the capacitor C21 of the drive voltage control circuit 12.

In the correction circuit 20, the switch SW91 is turned on under control of the control circuit 17, for example, at timing before the aforementioned APC period to thereby sample the terminal voltage of the semiconductor laser LD. In this manner, because sampling is performed at timing before the APC period, the terminal voltage stable before the increase in the temperature of the semiconductor laser LD can be sampled. The sampled voltage is used for the following correction process.

That is, the error amplifier 201 receives the terminal voltage of the semiconductor laser LD as a non-inverted input, compares the terminal voltage with the hold voltage of the capacitor C91, that is, with the reference voltage sequentially and supplies the error amplified voltage to the open end of the capacitor C21 of the drive voltage control circuit 12. On this occasion, because the gain of the error amplifier 201 is set to be 1, the hold voltage of the capacitor C21 shifts by the error amplified voltage. That is, the error amplified voltage is superposed as a correction value on the hold voltage of the capacitor C91. The corrected voltage is applied to the semiconductor laser LD when the semiconductor laser LD is driven to be switched on (to emit light).

Changeover control of the respective switches is performed by the control circuit 17 to thereby switch the voltage drive and the current drive over to each other. The changeover control by the control circuit 17 will be described specifically with reference to FIG. 5, which is a time chart of waveforms. In a modulation period, the "H"-level period of input data (A) is the period in which the semiconductor laser LD is switched on (emits light), and the "L"-level period of input data (A) is the period in which the semiconductor laser. LD is switched off.

At the beginning of the "H"-level period of input data (A), the control circuit 17 turns on the switches SW23 and SW24 of the drive voltage control circuit 12. As a result, the voltage held by the capacitor C22 is applied to the semiconductor laser LD through the switches SW23 and SW24. As a result, the semiconductor laser LD is driven with a constant voltage in a predetermined period of the leading edge of input data (A).

After the passage of the voltage drive period, the control circuit 17 turns off the switch SW23 of the drive voltage control circuit 12 and turns on the switch SW12 of the drive current control circuit 11. As a result, a drive current corresponding to the voltage held by the capacitor C11 (see FIG. 1) is output from the current source 112 so that the drive current is supplied to the semiconductor laser LD through the switch SW12. As a result, the semiconductor laser LD is driven with a constant current after the passage of the voltage drive period.

Next, at the beginning of the "L"-level period of input data (A), the control circuit 17 turns on the switch SW41 of the bias voltage setting circuit 14. As a result, the voltage held by the capacitor C42 is applied as a bias voltage $V_{bias}$ to the semiconductor laser LD through the switch SW41. The semiconductor laser LD supplied with the bias voltage $V_{bias}$ is driven with a constant voltage in a predetermined period of the trailing edge of input data (A).

After the passage of the voltage drive period, the control circuit 17 turns off the switch SW41 of the bias voltage setting circuit 14 and turns on the switch SW81 of the bias current supply circuit 18. As a result, a constant bias current $I_{bias}$ set by the bias current setting portion 19 is output from the current source 181 so that the bias current $I_{bias}$ is supplied to the semiconductor laser LD through the switch SW81. As a result, the semiconductor laser LD is driven with a constant current after the passage of the voltage drive period.

As described above, in the semiconductor laser driving device using a constant voltage drive and a constant current drive in combination, when the constant voltage drive is shifted to the constant current drive after the semiconductor laser LD is driven with a constant voltage in the period of the leading/trailing edge for switching on/off the semiconductor laser LD, the temperature of the semiconductor laser LD can be detected on the basis of the change of the terminal voltage of the semiconductor laser LD in the constant current drive period. Further, when the drive voltage of the semiconductor laser LD is controlled on the basis of the detection of the temperature of the semiconductor laser LD so that the intensity of light can be always kept constant, control of the light intensity of the semiconductor laser LD can be achieved by the voltage drive with accuracy equal to that of the current drive. The light intensity control based on the detection of the temperature is performed by a system including the correction circuit 20.

A correcting operation in the system including the correction circuit 20 is performed in a laser switching-off period in which a bias current $I_{bias}$ slightly lower than the emission threshold current of the semiconductor laser LD is supplied to the semiconductor laser LD to make the current drive after the voltage drive is made in response to the "L"-level of input data (A). As a result, variation in light intensity caused by the temperature change ΔT is corrected.

Specifically, in the error amplifier 201, the terminal voltage of the semiconductor laser LD is compared with the hold voltage of the capacitor C91, so that the error amplified voltage is given to the open end of the capacitor C21. As a result, the error amplified voltage is superposed as a correction value on the hold voltage of the capacitor C21, so that the superposed voltage is applied as a corrected voltage to the semiconductor laser LD. As a result, variation in light intensity caused by the temperature change ΔT is corrected, so that the intensity of light is kept constant even in the case where the temperature change ΔT remains.

Assuming now that a long time is required for shifting the constant voltage drive to the constant current drive when the on (or off) state of the semiconductor laser LD is changed over to the off (or on) state in a semiconductor laser driving device using the constant voltage drive and the constant current drive in combination, then the drive voltage of the semiconductor laser LD cannot be corrected on the basis of the temperature during the shifting time. Particularly in the case of halftone printing in which a short lighting time is repeated in the field of laser xerography using the semiconductor laser LD as a light source, there is a problem that the shifting time may have bad influence on correction of variation in light intensity caused by the temperature change.

On the contrary, in the semiconductor laser driving device according to the second embodiment, a bias current $I_{bias}$ is set by the bias current setting portion 19 on the basis of the bias voltage $V_{bias}$ set by the bias voltage setting circuit 14, so that the bias current $I_{bias}$ is supplied to the semiconductor laser LD at the time of switching off the semiconductor laser LD. Accordingly, the voltage at the voltage drive operation is made substantially equal to the voltage at the current drive operation, so that the width of voltage fluctuation at the time of shifting the voltage drive to the current drive is reduced. Furthermore, because the bias current $I_{bias}$ flowing in the semiconductor laser LD is set to be slightly smaller than the emission threshold current, impedance of the semiconductor laser LD at the time of switching off the semiconductor laser LD can be reduced. Accordingly, the time requiring for shifting the constant voltage drive to the constant current drive can be shortened. As a result, the period in which the constant voltage drive is shifted to the constant current drive and in which correction for temperature cannot work can be minimized, so that the first embodiment can make a great contribution to improvement in temperature compensating accuracy.

Figure 11:
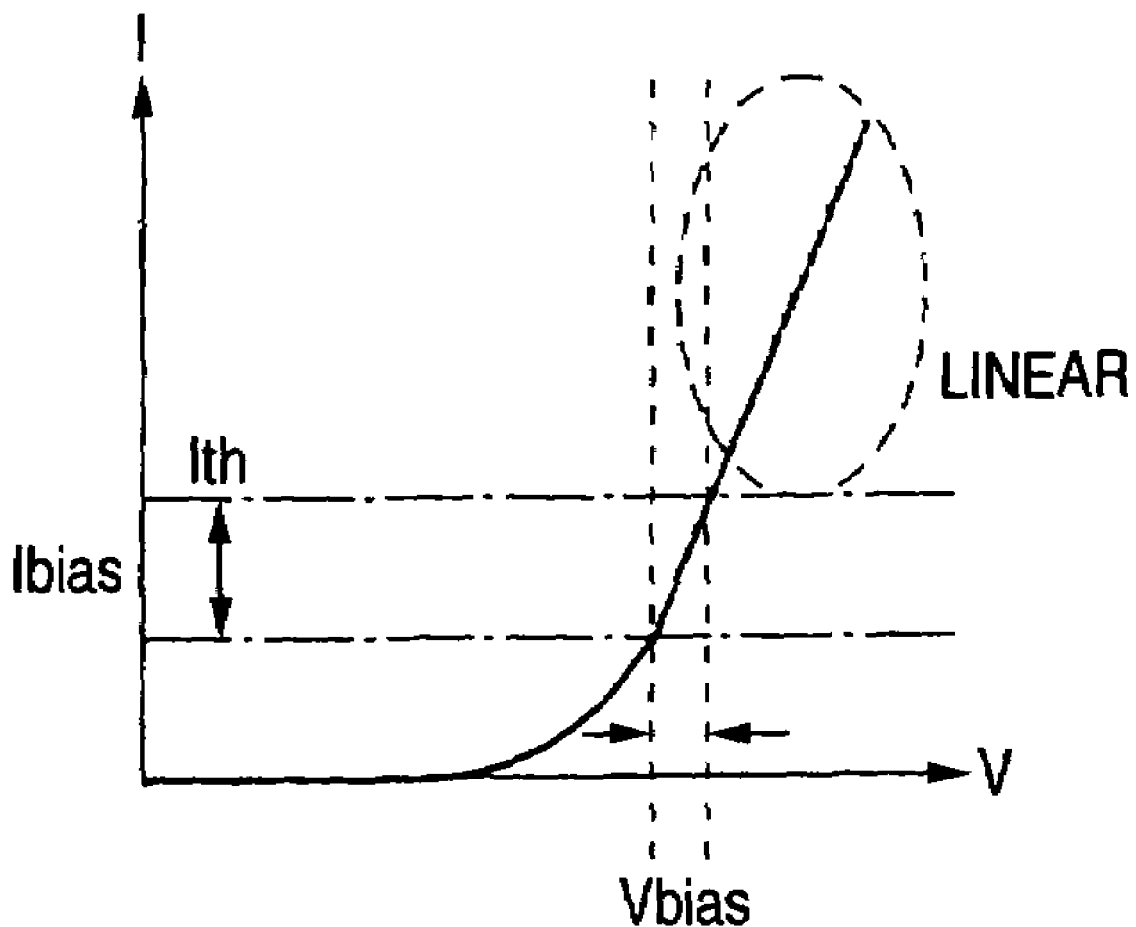
FIG. 11 is a graph of voltage-current characteristic of a semiconductor laser.

Incidentally, as described above, in the semiconductor laser LD, the drive current I varies exponentially according to the drive voltage V (see FIG. 11). As shown in FIG. 6, the V-I characteristic (voltage-current characteristic) varies according to the temperature change. Accordingly, if a bias voltage $V_{bias}1$ is continuously applied to the semiconductor laser LD in spite of increase in temperature of the semiconductor laser LD in the condition that the bias voltage $I_{bias}$ is set one the basis of the bias voltage $V_{bias}1$ when, for example, the temperature is low, the bias current $I_{bias}$ increases according to the variation in V-I characteristic. If it comes to the worst case, the bias current $I_{bias}$ will exceed the threshold current $I_{th}$ so that the semiconductor laser LD may emit light.

Therefore, the setting of the bias voltage $V_{bias}$ by the bias voltage setting circuit 14 and the setting of the bias current $I_{bias}$ by the bias current setting portion 19 may be performed at intervals of a predetermined cycle, for example, a cycle of APC (light intensity control). For example, in the V-I characteristic shown in FIG. 6, a constant test current (approximated as $I_{bias}$ in FIG. 6) is supplied to the semiconductor laser LD so that the bias voltage is readjusted to a bias voltage $V_{bias}2$ on the basis of increase in temperature. Accordingly, even in the case where the V-I characteristic of the semiconductor laser LD varies according to the temperature change, the bias current $I_{bias}$ flowing in the semiconductor laser LD can be kept constant.

Incidentally, in the first embodiment, in the voltage drive type semiconductor laser driving device, the drive current of the semiconductor laser LD is controlled so that the light intensity of the semiconductor laser LD is made equal to the set light intensity, and the terminal voltage of the semiconductor laser LD with the set light intensity is detected so that the drive voltage applied to the semiconductor laser LD at the time of switching on the semiconductor laser LD is set on the basis of the detected voltage (terminal voltage). The setting of the drive voltage can be also applied to the voltage drive in the semiconductor laser driving device according to the second embodiment.

Further, the second embodiment is the same as the first embodiment in that the terminal voltage of the semiconductor laser LD supplied with the test current is detected so that the bias voltage $V_{bias}$ applied to the semiconductor laser LD at the time of switching off the semiconductor laser LD is set on the basis of the detected voltage.

Figure 7:
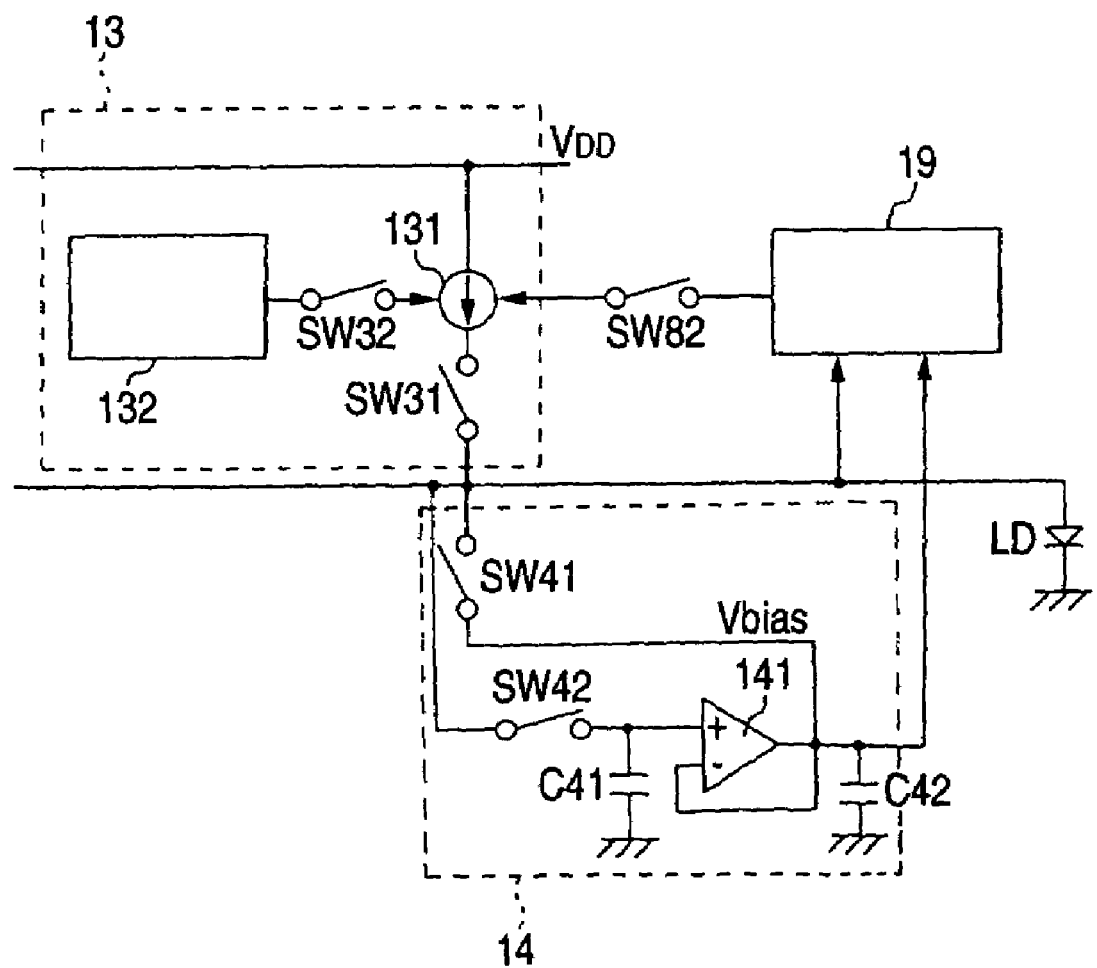
FIG. 7 is a circuit diagram showing an example of configuration of important part of the light-emitting element driving device according to a modification of the second embodiment of the invention.

FIG. 7 is a circuit diagram showing an example of configuration of important part of the light-emitting element driving device, that is, the semiconductor laser driving device according to a first modification of the second embodiment. In FIG. 7, parts the same as those in FIG. 4 are denoted by the same reference numerals as those in FIG. 4.

The semiconductor laser driving device according to the second embodiment is configured so that the test current supply circuit 13 and the bias current supply circuit 18 include the current sources 131 and 181 respectively. On the contrary, the semiconductor laser driving device according to the first modification of the second embodiment is configured so that a current source 131 is used in common to the two current supply circuits 13 and 18. Specifically, as is obvious from FIG. 7, the current source 131 of the test current supply circuit 13 serves also as the current source 181 (see FIG. 4) of the bias current supply circuit 18.

The reason why the current source 131 can be used in common to the two current supply circuits 13 and 18 is as follows. That is, the bias current supply circuit 18 needs to operate only in the period in which the semiconductor laser LD is switched off, whereas the test current supply circuit 13 needs to operate only in a partial period except the APC period and the modulation period. Accordingly, the operating period of the test current supply circuit 13 and the operating period of the bias current supply circuit 18 can be set so as not to overlap each other.

Because the current source 131 is used in common to the test current supply circuit 13 and the bias current supply circuit 18 in this manner, one current source 181 can be dispensed with. Accordingly, consumed electric power can be reduced as well as simplification in circuit configuration and reduction in cost can be attained. It is however necessary to provide a switch SW32 between the current source 131 and the test current setting portion 132 and a switch SW82 between the current source 131 and the bias current setting portion 19 as shown in FIG. 7 so that the respective outputs of the test current setting portion 132 and the bias current setting portion 19 are not given to the current source 131 continuously.

Although the first modification of the second embodiment has shown the case where the current source 131 is used in common to the test current supply circuit 13 and the bias current supply circuit 18, the invention may be also applied to the case where the current source 131 of the test current supply circuit 13 is used to serve also as the current source (the current source for the drive current at the time of switching off the semiconductor laser LD) 113 of the drive current control circuit 11. The use of the current source 131 in common to the test current supply circuit 13 and the drive current control circuit 11 can be also applied to the semiconductor laser driving device according to the first embodiment.

Although the first and second embodiments have been described upon the case where each embodiment is applied to a driving device for driving a single light-emitting element, specifically for driving a single semiconductor laser LD, the invention is not limited to the driving device for driving a single light-emitting element. For example, the invention may be also applied to a driving device for driving a plurality of light-emitting elements such as a surface emission laser (multi-laser) having a large number of light-emitting portions emitting laser beams respectively. This is a light-emitting element driving device according to a third embodiment of the invention as will be described below.

Figure 8:
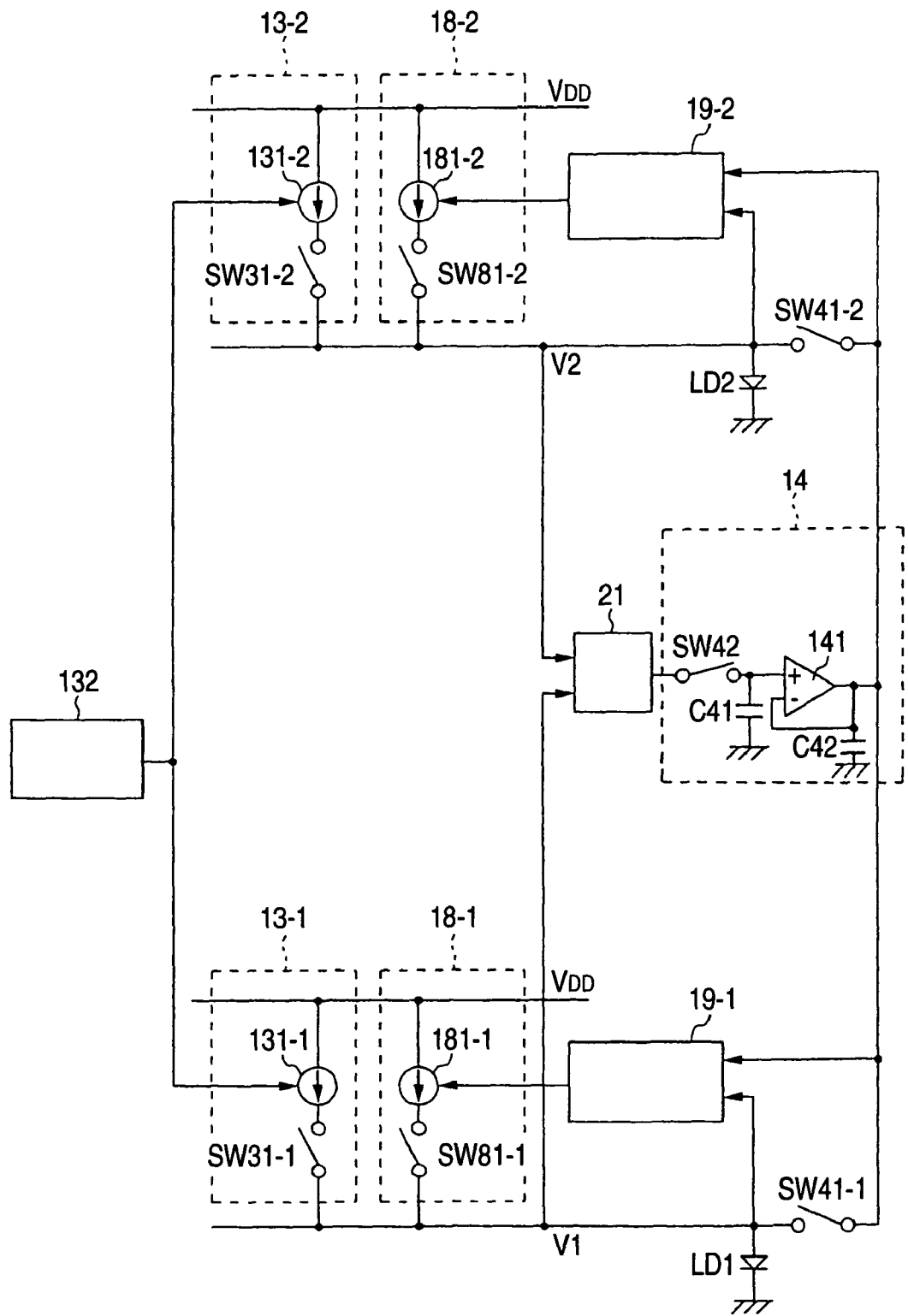
FIG. 8 is a circuit diagram showing an example of configuration of the light-emitting element driving device according to a third embodiment of the invention.

FIG. 8 is a block diagram showing an example of configuration of important part of the light-emitting element driving device, that is, the multi-laser driving device according to the third embodiment of the invention. In FIG. 8, parts the same as those in FIG. 4 are denoted by the same reference numerals as those in FIG. 4.

The case where the configuration of the semiconductor laser driving device according to the second embodiment is used as a basic configuration will be described by way of example here but it is also possible to use the configuration of the semiconductor laser driving device according to the first embodiment as a basic configuration. The light intensity detection circuit 15 shown in FIG. 1 and the drive current control circuit 11, the control circuit 17 and the correction circuit 20 shown in FIG. 3 are not shown in FIG. 8. The large number of light-emitting portions in the multi-laser (surface emission laser) are represented by two light-emitting portions LD1 and LD2 (hereinafter referred to as semiconductor lasers LD1 and LD2) for the sake of simplification of the drawing.

In FIG. 8, test current supply circuits 13-1 and 13-2, bias current supply circuits 18-1 and 18-2 and bias current setting portions 19-1 and 19-2 are provided in correspondence with the two semiconductor lasers LD1 and LD2. A test current setting portion 132 and a bias voltage setting circuit 14 are provided in common to the two semiconductor lasers LD1 and LD2. Incidentally, the test current setting portion 132 maybe provided for each of the test current supply circuits 13-1 and 13-2 in the same manner as in the first or second embodiment. The provision of the test current setting portion 132 in common to the test current supply circuits 13-1 and 13-2 has however an advantage in that reduction in cost is attained.

In the multi-laser driving device according to the third embodiment, a result of an arithmetic operation for the respective terminal voltages of the two semiconductor lasers LD1 and LD2 is used for setting the bias voltage $V_{bias}$ by the bias voltage setting circuit 14. Therefore, an arithmetic circuit 21 is provided as a stage in front of the bias voltage setting circuit 14.

The arithmetic circuit 21 makes an arithmetic operation, for example, of an average value (V1+V2)/2 by using the respective terminal voltages V1 and V2 of the semiconductor lasers LD1 and LD2 which are supplied with test currents smaller than the emission threshold currents, preferably, slightly smaller than the emission threshold currents from the test current supply circuits 13-1 and 13-2 respectively. Incidentally, calculation of a voltage value is not limited to calculation of such an average value. For example, a voltage value between the minimum and maximum values of the respective terminal voltages and except the minimum and maximum values may be used. Specifically, a value as center as possible in variation in characteristic of the semiconductor lasers, such as a median, a mode, etc., may be preferably used.

The voltage value (V1+V2)/2 which is a result of the arithmetic operation by the arithmetic circuit 21 is given to the bias voltage setting circuit 14. In the bias voltage setting circuit 14, the voltage value (V1+V2)/2 is sampled by the switch SW42 and held by the capacitor C41. The voltage held by the capacitor C41 is applied as a bias voltage $V_{bias}$ to the anodes of the semiconductor lasers LD1 and LD2 when the switches SW41-1 and SW41-2 are turned on at the time of switching off the semiconductor lasers LD1 and LD2.

The voltage held by the capacitor C41 is also supplied to the bias current setting portions 19-1 and 19-2. Each of the bias current setting portions 19-1 and 19-2 is formed like the bias current setting portion 19 shown in FIG. 4. That is, for example, each of the bias current setting portions 19-1 and 19-2 includes a differential amplifier, and a sample-and-hold circuit. The respective currents of the current sources 181-1 and 181-2, that is, bias currents $I_{bias}$ are set on the basis of such negative feedback control that the terminal voltages V1 and V2 of the semiconductor lasers LD1 and LD2 coincide with the bias voltage $V_{bias}$ set by the bias voltage setting circuit 14 when the semiconductor lasers LD1 and LD2 are switched off. When the configuration of negative feedback control is used, control can be performed by a simple configuration so that the terminal voltages of the semiconductor lasers LD1 and LD2 at the time of switching off the semiconductor lasers LD1 and LD2 coincide with the calculated common bias voltage $V_{bias}$.

Voltage-current drive (voltage drive->current drive) can be performed as follows. When the switches SW41-1 and SW41-2 are turned on, the bias voltage $V_{bias}$ with a voltage value (V1+V2)/2 set by the bias voltage setting circuit 14 is applied to the anodes of the semiconductor lasers LD1 and LD2 through the switches SW41-1 and SW41-2 (Voltage Drive). Then, when the switches SW41-1 and SW41-2 are turned off and the switches SW81-1 and SW81-2 of the bias current supply circuits 18-1 and 18-2 are turned on, the bias currents $I_{bias}$ set on the basis of the bias voltage $V_{bias}$ by the bias current setting portions 19-1 and 19-2 are supplied from the current sources 181-1 and 181-2 to the semiconductor lasers LD1 and LD2 respectively (Current Drive).

In the voltage-current drive, because the voltage value of the bias voltage $V_{bias}$ corresponds to the current value of the bias current $I_{bias}$ set on the basis of the bias voltage $V_{bias}$, the voltage value V1/V2 of the terminal voltage of each semiconductor laser LD1/LD2 converges rapidly into the voltage value for the current drive when the voltage drive is shifted to the current drive.

As described above, in the multi-laser driving device according to the third embodiment, a test current is supplied to each semiconductor laser when a plurality of semiconductor lasers (e.g., two semiconductor lasers in the third embodiment) are switched off. An arithmetic operation for the terminal voltages of the semiconductor lasers supplied with the test current is carried out. A bias voltage $V_{bias}$ applied to each semiconductor laser at the time of switching off the semiconductor laser is set on the basis of the calculated voltage value. Accordingly, one bias voltage setting circuit 14 can be provided in common to the plurality of semiconductor lasers. In other words, bias voltage setting circuits 14 each including a capacitor C41 need not be provided for the plurality of semiconductor lasers respectively. Accordingly, simplification in circuit configuration and reduction in cost can be attained.

Particularly when a voltage value between the minimum and maximum values of the respective terminal voltages of the plurality of semiconductor lasers and except the minimum and maximum values, such as an average, a median, a mode, etc., is calculated so that the bias voltage $V_{bias}$ is set by the calculated voltage value, the voltage value of the bias voltage $V_{bias}$ can be set to be near the center value of variation in characteristic of the semiconductor lasers even in the case where characteristic of the semiconductor lasers varies. Accordingly, the drive condition common to all the semiconductor lasers can be prevented from being prejudiced extremely as if the bias voltage $V_{bias}$ was set on the basis of the maximum or minimum of variation in characteristic of the semiconductor lasers.

If variation in characteristic of the semiconductor lasers is large, there is a possibility that several beams may be emitted slightly or the modulation speed may become slow. In laser xerography using a laser array, because the influence of one laser on image quality is divided by the number of lasers, this is insignificant compared with a single laser. Accordingly, specifications of the semiconductor lasers can be loosened. This makes a great contribution to improvement in yield.

When bias currents $I_{bias}$ are set on the basis of the bias voltage $V_{bias}$ so that the bias currents $I_{bias}$ are supplied to the plurality of semiconductor lasers respectively at the time of switching off the semiconductor lasers, the voltage at the voltage drive operation can be made substantially equal to the voltage at the current drive operation. Accordingly, the width of voltage fluctuation is reduced when the voltage drive is shifted to the current drive. Accordingly, the time required for shifting the constant voltage drive to the constant current drive can be shortened. As a result, the period for shifting to the constant current operation in which correction for temperature cannot work can be minimized. This can make a great contribution to improvement in temperature compensating accuracy described in the second embodiment.

Figure 9:
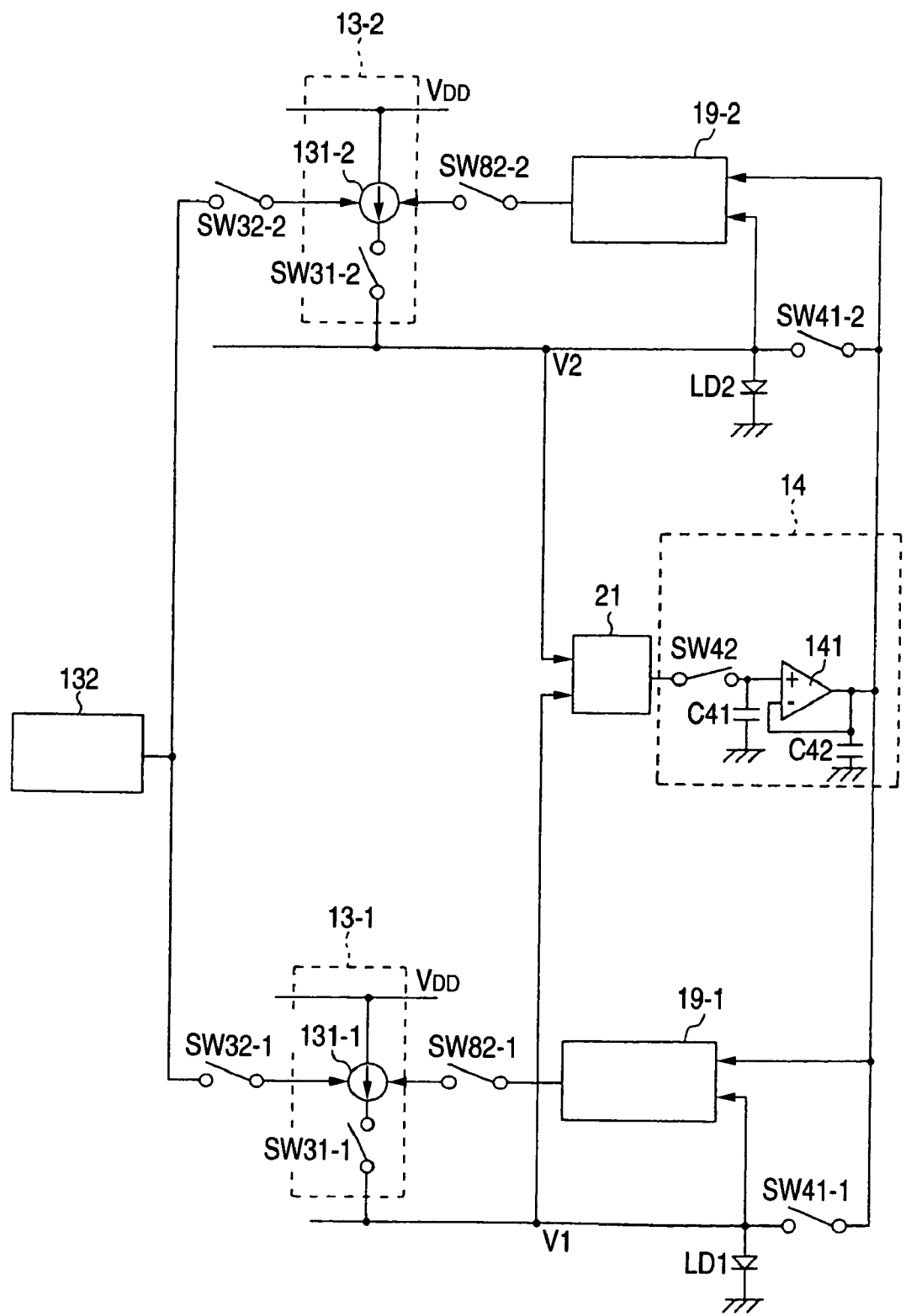
FIG. 9 is a circuit diagram showing an example of configuration of important part of the light-emitting element driving device according to a modification of the third embodiment.

FIG. 9 is a circuit diagram showing an example of configuration of the light-emitting element driving device, that is, the semiconductor laser driving device according to a first modification of the third embodiment. In FIG. 9, parts the same as those in FIG. 8 are denoted by the same reference numerals as those in FIG. 8.

The first modification of the third embodiment is configured on the same gist as that of the modification of the second embodiment. That is, the current sources 131-1 and 131-2 of the test current supply circuits 13-1 and 13-2 are used so as to serve as the current sources 181-1 and 181-2 of the bias current supply circuits 18-1 and 18-2 respectively.

Because the current sources 131-1 and 131-2 are used in common to the test current supply circuits 13-1 and 13-2 and the bias current supply circuits 18-1 and 18-2 in this manner, one current source per semiconductor laser can be dispensed with. Accordingly, consumed electric power can be reduced as well as simplification in circuit configuration and reduction in cost can be attained. The effect increases as the number of semiconductor lasers increases.

Figure 10:
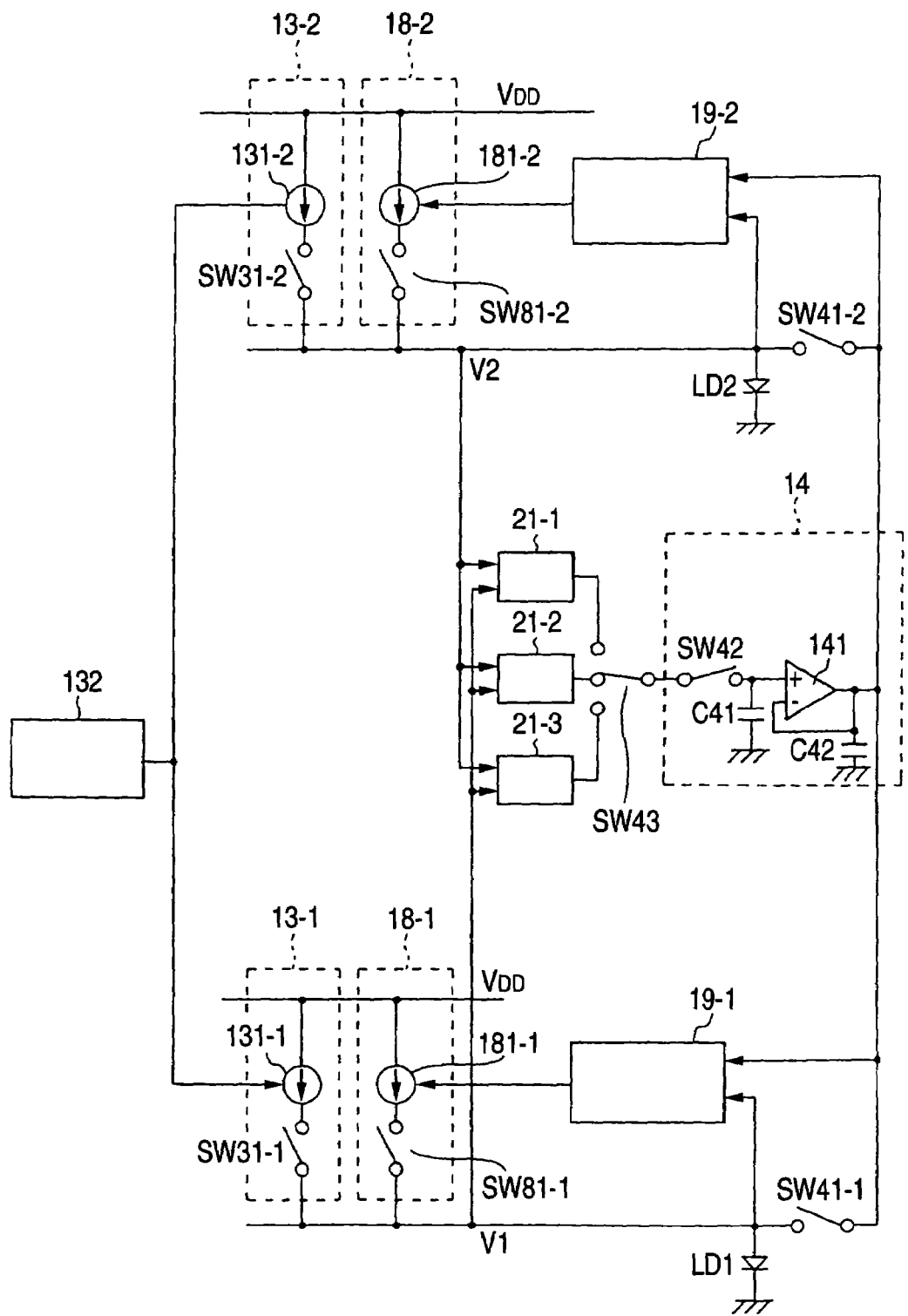
FIG. 10 is a circuit diagram showing an example of configuration of the light-emitting element driving device according to a fourth embodiment of the invention.

FIG. 10 is a block diagram showing an example of configuration of important part of the light-emitting element driving device, that is, the multi-laser driving device according to a fourth embodiment of the invention. In FIG. 10, parts the same as those in FIG. 8 are denoted by the same reference numerals as those in FIG. 8.

Although the multi-laser driving device according to the third embodiment is configured so that a single voltage value (V1+V2)/2 is calculated by a single arithmetic circuit 21, the multi-laser driving device according to the fourth embodiment is configured so that a plurality of voltage values (e.g., three voltage values) are calculated by a plurality of arithmetic circuits (e.g., three arithmetic circuits 21-1, 21-2 and 21-3). The other configuration of the multi-laser driving device according to the fourth embodiment is the same as that of the multi-laser driving device according to the third embodiment. One voltage value is selected from the calculated three voltage values by the switch SW43 and given to the bias voltage setting circuit 14.

One 21-1 of the three arithmetic circuits 21-1, 21-2 and 21-3 calculates a voltage value (2V1+V2)/3. Another arithmetic circuit 21-2 calculates a voltage value (V1+V2)/2. The last arithmetic circuit 21-3 calculates a voltage value (V1+2V2)/3. Incidentally, these calculated values are provided not for limitation but for exemplification. For example, four or more optional voltage values between V1 and V2 (the maximum and minimum values) may be calculated.

As described above, in the multi-laser driving device according to the fourth embodiment, a plurality of voltage values are calculated by arithmetic operations using the respective terminal voltages of the plurality of semiconductor lasers supplied with the test current. A voltage value is selected from the plurality of voltage values and applied as a bias voltage $V_{bias}$ to the plurality of semiconductor lasers at the time of switching off the semiconductor lasers. Bias currents $I_{bias}$ supplied to the plurality of semiconductor lasers respectively at the time of switching off the semiconductor lasers are set on the basis of the selected voltage value. Accordingly, the optimal bias voltage $V_{bias}$ and bias current $I_{bias}$ can be selected from several options in accordance with the distribution of variation in characteristic of the plurality of semiconductor lasers. As a result, more accurate drive control can be achieved.

Although the embodiments have been described, byway of example, upon the case where a GaN blue laser or a single mode surface emission laser is used as a light-emitting element to be driven, the invention is not limited to application to drive of these laser elements and may be also applied to voltage drive for general light-emitting elements high in internal resistance such as EL (Electro-Luminescence) elements.

As described above, according to a first aspect of the invention, there is provided a light-emitting element driving device including: a first control unit adapted to control a drive voltage applied from a voltage source to a light-emitting element; a second control unit adapted to control a drive current supplied from a current source to said light-emitting element; a test current supply unit adapted to supply a test current to the light-emitting element when the light-emitting element is switched off; and a bias voltage setting unit adapted to set a bias voltage applied to the light-emitting element on the basis of a terminal voltage of the light-emitting element supplied with the test current from the test current supply unit when the light-emitting element is switched off, wherein, the first control unit and the second control unit controls an light intensity of a light beam emitted from the light-emitting element.

According to the first aspect of the invention, a voltage drive and a current drive (voltage drive->current drive) are used in combination. For setting of the bias voltage, a current expected to flow in the light-emitting element at the time of switching off the light-emitting element is actually supplied as a test current from the test current supply unit to the light-emitting element in a period in which neither light intensity control nor modulation is performed. Thus, a terminal voltage of the light-emitting element supplied with the test current is detected. Then, the bias voltage setting unit sets the bias voltage applied to the light-emitting element at the time of switching off the light-emitting element on the basis of the detected voltage. Accordingly, the bias voltage applied to the light-emitting element at the time of switching off the light-emitting element can be easily set to be a target value compared with the related art in which it was difficult to control the current because the current varied widely according to slight voltage change.

According to a second aspect of the invention, in addition to the first aspect of the invention, the second control unit controls the drive current when the light intensity of light beam emitted from the light-emitting element is in control, and the first control unit sets the drive voltage in accordance with a voltage generated in the light-emitting element as a result of the control of the drive current by the second control unit.

According to the second aspect of the invention, the drive current of the light-emitting element is controlled by the second control unit so that the light intensity of light beam emitted from the light-emitting element is equal to predetermined intensity of light. Thus, the terminal voltage of the light-emitting element is detected when the intensity of light emitted from the light-emitting element is equal to the predetermined intensity of light. The first control unit sets the voltage value of the voltage applied from the voltage source to the light-emitting element at the time of switching on the light-emitting element on the basis of the detected voltage (terminal voltage). Accordingly, because the drive current of the light-emitting element, particularly a semiconductor laser is substantially proportional to the intensity of light, the gain of a negative feedback loop for controlling the intensity of light can be kept constant. Accordingly, stable control can be achieved.

According to a third aspect of the invention, in addition to the first aspect of the invention, the first control unit controls the drive voltage when the light intensity of light beam emitted from the light-emitting element is in control, and the second control unit sets the drive current in accordance with a current flowing in the light-emitting element as a result of the control of the drive voltage by the first control unit.

According to the third aspect of the invention, when the internal resistance of the light-emitting element is very high, a long time is required for convergence into the target light intensity because of the influence of a time constant decided on the basis of the internal resistance and capacitance of the light-emitting element if the current source is controlled to drive the current at the time of controlling the light intensity. In this case, however, the time of convergence in the light intensity control can be shortened when the voltage source with low output impedance is controlled to drive the voltage.

According to a fourth aspect of the invention, there is provided a light-emitting element driving device for controlling a drive voltage applied from a voltage source to a light-emitting element while controlling a drive current supplied from a current source to the light-emitting element to thereby control an light intensity of a light beam emitted from the light-emitting element, the light-emitting element driving device including: a bias current supply unit adapted to supply a bias current to the light-emitting element; a test current supply unit adapted to supply a test current to the light-emitting element when the light-emitting element is switched off; a bias voltage setting unit adapted to set a bias voltage applied to the light-emitting element on the basis of a terminal voltage of the light-emitting element supplied with the test current from the test current supply unit when said light-emitting element is switched off; and a bias current setting unit adapted to set the bias current supplied from the bias current supply unit to the light-emitting element on the basis of the bias voltage set by the bias voltage setting unit when the light-emitting element is switched off.

According to the fourth aspect of the invention, a voltage drive and a current drive (voltage drive->current drive) are used in combination. The bias current to flow in the light-emitting element by the current drive at the time of switching off the light-emitting element is set by the bias current setting unit on the basis of the bias voltage set by the bias voltage setting unit. The bias current is supplied from the bias current supply unit to the light-emitting element when the light-emitting element is switched off. As a result, the voltage at the voltage drive operation becomes substantially equal to the voltage at the current drive operation, so that the change width of the voltage at the time of transition from the voltage drive to the current drive is reduced. Accordingly, the time required for transition from the constant voltage drive to the constant current drive can be shortened.

According to a fifth aspect of the invention, in addition to the fourth aspect of the invention, the bias current setting unit sets the bias current by performing negative feedback control to make the terminal voltage of the light-emitting element coincides with the bias voltage set by the bias voltage setting unit.

According to the fifth aspect of the invention, when, for example, negative feedback control using a differential amplifier is used, control can be performed by simple configuration so that the terminal voltage of the light-emitting element at the time of switching off the light-emitting element coincides with the set bias voltage.

According to a sixth aspect of the invention, in addition to the fourth aspect of the invention, the setting of the bias voltage by the bias voltage setting unit and the setting of the bias current by the bias current setting unit are performed at intervals of a predetermined cycle to thereby readjust the bias current in accordance with voltage-current characteristic change of the light-emitting element due to temperature change.

According to the sixth aspect of the invention, when the setting of the bias voltage and the setting of the bias current are performed at intervals of a predetermined cycle, for example, a light intensity control cycle to thereby readjust the bias current in accordance with voltage-current characteristic change of the light-emitting element due to temperature change, the bias current to flow in the light-emitting element can be kept constant even in the case where the voltage-current characteristic of the light-emitting element varies according to the temperature change.

According to a seventh aspect of the invention, in addition to the fourth aspect of the invention, a current source for the bias current supply unit serves also as a current source for the test current supply unit.

According to the seventh aspect of the invention, because a current source can be used in common to the bias current supply unit and the test current supply unit, one current source can be saved. Accordingly, consumed electric power can be reduced as well as simplification of circuit configuration and reduction in cost can be attained.

According to an eighth aspect of the invention, there is provided a light-emitting element driving device for controlling a drive voltage applied from a voltage source to a plurality of light-emitting elements while controlling a drive current supplied from a current source to the plurality of light-emitting elements to thereby control the light intensity of light beams emitted from the plurality of light-emitting elements, the light-emitting element driving device including: a test current supply unit adapted to supply a test current to the light-emitting element when the light-emitting element is switched off; an arithmetic unit adapted to carry out an arithmetic operation for respective terminal voltages of the plurality of light-emitting elements supplied with the test current from the test current supply unit; and a bias voltage setting unit for adapted to set a bias voltage applied to the plurality of light-emitting elements on the basis of a voltage value calculated by the arithmetic unit when the plurality of light-emitting elements are switched off.

According to the eighth aspect of the invention, one bias voltage setting circuit can be provided in common to the plurality of light-emitting elements. Accordingly, simplification of circuit configuration and reduction in cost can be attained.

According to a ninth aspect of the invention, in addition to the eighth aspect of the invention, the arithmetic unit calculates the voltage value between a maximum value and a minimum value of the respective terminal voltages of the plurality of light-emitting elements and except the maximum value and the minimum value.

According to the ninth aspect of the invention, when a voltage value between the maximum value and the minimum value of the respective terminal voltages of the plurality of light-emitting elements and except the maximum and the minimum values, such as an average, a median, a mode, etc., is calculated and set as the bias voltage, the voltage value of the bias voltage can be set to be near the center value of variations in characteristic of the light-emitting elements even when there are variations in characteristic of the light-emitting elements. Accordingly, the drive condition common to all the light-emitting elements can be prevented from being prejudiced extremely.

According to a tenth aspect of the invention, in addition to the eighth aspect of the invention, the arithmetic unit calculates a plurality of voltage values and selects the voltage value of the bias voltage from the plurality of voltage values.

According to the tenth aspect of the invention, a plurality of voltage values are calculated by the arithmetic operation on the basis of the terminal voltages of the plurality of light-emitting elements supplied with the test current. A voltage value selected from the calculated voltage values is set as a bias voltage applied to the plurality of light-emitting elements at the time of switching off the plurality of light-emitting elements. Accordingly, an optimal bias voltage can be selected from several options according to the distribution of variations in characteristic of the plurality of light-emitting elements. As a result, drive control can be achieved with higher accuracy.

According to an eleventh aspect of the invention, in addition to the eighth aspect of the invention, the test current supply unit includes a unit common to the plurality of light-emitting elements for setting a current value of the test current.

According to the eleventh aspect of the invention, because the unit for setting the current value of the test current is used in common to the plurality of light-emitting elements, there is an advantage for attaining reduction in cost.

According to a twelfth aspect of the invention, there is provided a light-emitting element driving device for controlling a drive voltage applied from a voltage source to a plurality of light-emitting elements while controlling a drive current supplied from a current source to the plurality of light-emitting elements to thereby control the light intensity of light beams emitted from the plurality of light-emitting elements, the light-emitting element driving device including: a bias current supply unit adapted to supply bias currents to the plurality of light-emitting elements respectively; a test current supply unit adapted to supply a test current to the plurality of light-emitting elements when the plurality of light-emitting elements are switched off; an arithmetic unit adapted to carry out an arithmetic operation for respective terminal voltages of the plurality of light-emitting elements supplied with the test current from the test current supply unit; a bias voltage setting unit adapted to set a bias voltage applied to the plurality of light-emitting elements on the basis of a voltage value calculated by the arithmetic unit when the plurality of light-emitting elements are switched off; and a bias current setting unit adapted to set the bias currents supplied from the bias current supply unit to the plurality of light-emitting elements on the basis of the bias voltage set by the bias voltage setting unit when the plurality of light-emitting elements are switched off.

According to the twelfth aspect of the invention, a voltage drive and a current drive (voltage drive->current drive) are used in combination for each of the light-emitting elements. The bias currents to flow in the plurality of light-emitting elements by the current drive at the time of switching off the plurality of light-emitting elements are set by the bias current setting unit on the basis of the bias voltage set by the bias voltage setting unit. The bias currents are supplied from the bias current supply unit to the plurality of light-emitting elements when the plurality of light-emitting elements are switched off. As a result, the voltage at the voltage drive operation becomes substantially equal to the voltage at the current drive operation, so that the change width of the voltage at the time of transition from the voltage drive to the current drive is reduced. Accordingly, the time required for transition from the constant voltage drive to the constant current drive can be shortened for each of the light-emitting elements.

According to a thirteenth aspect of the invention, in addition to the twelfth aspect of the invention, the bias voltage setting unit calculates a plurality of voltage values and selects the voltage value of the bias voltage from the plurality of voltage values.

According to the thirteenth aspect of the invention, a plurality of voltage values are calculated by the arithmetic operation on the basis of the terminal voltages of the plurality of light-emitting elements supplied with the test current. A voltage value selected from the calculated voltage values is used as a bias voltage applied to the plurality of light-emitting elements at the time of switching off the plurality of light-emitting elements. Bias currents supplied to the plurality of light-emitting elements respectively at the time of switching off the plurality of light-emitting elements are set on the basis of the selected voltage value. Accordingly, an optimal bias voltage and optimal bias current can be selected from several options according to the distribution of variations in characteristic of the plurality of light-emitting elements. As a result, more accurate drive control can be achieved.

According to a fourteenth aspect of the invention, in addition to the twelfth aspect of the invention, the bias current supply unit sets the bias currents by performing negative feedback control to make each of the terminal voltages of the plurality of light-emitting elements coincides with the bias voltage set by the bias voltage setting unit.

According to the fourteenth aspect of the invention, when, for example, negative feedback control using a differential amplifier is used, control can be performed by simple configuration so that the terminal voltage of each of the plurality of light-emitting elements at the time of switching off the plurality of light-emitting elements coincides with the calculated common bias voltage.

According to a fifteenth aspect of the invention, in addition to the twelfth aspect of the invention, the setting of the bias voltage by the bias voltage setting unit and the setting of the bias currents by the bias current setting unit are performed at intervals of a predetermined cycle to thereby readjust the bias currents in accordance with voltage-current characteristic change of the plurality of light-emitting elements due to temperature change.

According to the fifteenth aspect of the invention, when the setting of the bias voltage and the setting of the bias currents are performed at intervals of a predetermined cycle, for example, a light intensity control cycle to thereby readjust the bias currents in accordance with voltage-current characteristic change of the light-emitting element due to temperature change, the bias currents to flow in the plurality of light-emitting elements respectively can be kept constant even in the case where the voltage-current characteristic of the plurality of light-emitting element varies according to the temperature change.

According to a sixteenth aspect of the invention, in addition to the twelfth aspect of the invention, a current source for the bias current supply unit serves also as a current source for the test current supply unit.

According to the sixteenth aspect of the invention, because a current source can be used in common to the bias current supply unit and the test current supply unit, one current source per light-emitting element can be dispensed with. Accordingly, consumed electric power can be reduced as well as simplification of circuit configuration and reduction in cost can be attained. The effect increases as the number of light-emitting elements increases.

According to a seventeenth aspect of the invention, in addition to the twelfth aspect of the invention, the test current supply unit includes a unit common to the plurality of light-emitting elements for setting a current value of the test current.

According to the seventeenth aspect of the invention, because the unit for setting the current value of the test current is used in common to the plurality of light-emitting elements, there is an advantage for attaining reduction in cost.

According to a eighteenth aspect of the invention, there is provided a light-emitting element driving device including: a first control unit adapted to control a drive voltage applied from a voltage source to a light-emitting element; and a second control unit adapted to control a drive current supplied from a current source to the light-emitting element, wherein the first control unit and the second control unit controls an light intensity of a light beam emitted from the light-emitting element, wherein the first control unit sets a voltage of the voltage source in accordance with a voltage generated in the light-emitting element as a result of the control of the drive current by the second control unit.

According to the eighteenth aspect of the invention, the drive current of the light-emitting element is controlled by the second control unit so that the intensity of light emitted from the light-emitting element is equal to set light intensity. The terminal voltage of the light-emitting element is detected when the intensity of light emitted from the light-emitting element is equal to the set light intensity. The second control unit sets the drive voltage applied to the light-emitting element at the time of switching off the light-emitting element on the basis of the detected voltage (terminal voltage). Accordingly, because the drive current of the light-emitting element, particularly a semiconductor laser is substantially proportional to the intensity of light, the gain of a negative feedback loop for controlling the intensity of light can be kept constant. Accordingly, stable control can be achieved.

Although the present invention has been shown and described with reference to specific preferred embodiments, various changes and modifications will be apparent to those skilled in the art from the teachings herein. Such changes and modifications as are obvious are deemed to come within the spirit, scope and contemplation of the invention as defined in the appended claims.

What is claimed is:

1. A light-emitting element driving device comprising:
   a first control unit adapted to control a drive voltage applied from a voltage source to a light-emitting element;
   a second control unit adapted to control a drive current supplied from a current source to said light-emitting element;
   a test current supply unit adapted to supply a test current to the light-emitting element when the light-emitting element is switched off; and
   a bias voltage setting unit adapted to set a bias voltage applied to the light-emitting element on the basis of a terminal voltage of the light-emitting element supplied with the test current from the test current supply unit when the light-emitting element is switched off,
   wherein, the first control unit and the second control unit controls an light intensity of a light beam emitted from the light-emitting element.

2. The light-emitting element driving device as claimed in claim 1, wherein the second control unit controls the drive current when the light intensity of light beam emitted from the light-emitting element is in control, and
   wherein the first control unit sets the drive voltage in accordance with a voltage generated in the light-emitting element as a result of the control of the drive current by the second control unit.

3. The light-emitting element driving device as claimed in claim 1, wherein the first control unit controls the drive voltage when the light intensity of light beam emitted from the light-emitting element is in control, and
   wherein the second control unit sets the drive current in accordance with a current flowing in the light-emitting element as a result of the control of the drive voltage by the first control unit.

4. A light-emitting element driving device for controlling a drive voltage applied from a voltage source to a light-emitting element while controlling a drive current supplied from a current source to the light-emitting element to thereby control an light intensity of a light beam emitted from the light-emitting element, the light-emitting element driving device comprising:
   a bias current supply unit adapted to supply a bias current to the light-emitting element;
   a test current supply unit adapted to supply a test current to the light-emitting element when the light-emitting element is switched off;
   a bias voltage setting unit adapted to set a bias voltage applied to the light-emitting element on the basis of a terminal voltage of the light-emitting element supplied with the test current from the test current supply unit when said light-emitting element is switched off; and
   a bias current setting unit adapted to set the bias current supplied from the bias current supply unit to the light-emitting element on the basis of the bias voltage set by the bias voltage setting unit when the light-emitting element is switched off.

5. The light-emitting element driving device as claimed in claim 4, wherein the bias current setting unit sets the bias current by performing negative feedback control to make the terminal voltage of the light-emitting element coincides with the bias voltage set by the bias voltage setting unit.

6. The light-emitting element driving device as claimed in claim 4, wherein the setting of the bias voltage by the bias voltage setting unit and the setting of the bias current by the bias current setting unit are performed at intervals of a predetermined cycle to thereby readjust the bias current in accordance with voltage-current characteristic change of the light-emitting element due to temperature change.

7. The light-emitting element driving device as claimed in claim 4, wherein a current source for the bias current supply unit serves also as a current source for the test current supply unit.

8. A light-emitting element driving device for controlling a drive voltage applied from a voltage source to a plurality of light-emitting elements while controlling a drive current supplied from a current source to the plurality of light-emitting elements to thereby control the light intensity of light beams emitted from the plurality of light-emitting elements, the light-emitting element driving device comprising:
- a test current supply unit adapted to supply a test current to the light-emitting element when the light-emitting element is switched off;
- an arithmetic unit adapted to carry out an arithmetic operation for respective terminal voltages of the plurality of light-emitting elements supplied with the test current from the test current supply unit; and
- a bias voltage setting unit for adapted to set a bias voltage applied to the plurality of light-emitting elements on the basis of a voltage value calculated by the arithmetic unit when the plurality of light-emitting elements are switched off.

9. The light-emitting element driving device as claimed in claim 8, wherein the arithmetic unit calculates the voltage value between a maximum value and a minimum value of the respective terminal voltages of the plurality of light-emitting elements and except the maximum value and the minimum value.

10. The light-emitting element driving device as claimed in claim 8, wherein the arithmetic unit calculates a plurality of voltage values and selects the voltage value of the bias voltage from the plurality of voltage values.

11. The light-emitting element driving device as claimed in claim 8, wherein the test current supply unit includes a unit common to the plurality of light-emitting elements for setting a current value of the test current.

12. A light-emitting element driving device for controlling a drive voltage applied from a voltage source to a plurality of light-emitting elements while controlling a drive current supplied from a current source to the plurality of light-emitting elements to thereby control the light intensity of light beams emitted from the plurality of light-emitting elements, the light-emitting element driving device comprising:
- a bias current supply unit adapted to supply bias currents to the plurality of light-emitting elements respectively;
- a test current supply unit adapted to supply a test current to the plurality of light-emitting elements when the plurality of light-emitting elements are switched off;
- an arithmetic unit adapted to carry out an arithmetic operation for respective terminal voltages of the plurality of light-emitting elements supplied with the test current from the test current supply unit;
- a bias voltage setting unit adapted to set a bias voltage applied to the plurality of light-emitting elements on the basis of a voltage value calculated by the arithmetic unit when the plurality of light-emitting elements are switched off; and
- a bias current setting unit adapted to set the bias currents supplied from the bias current supply unit to the plurality of light-emitting elements on the basis of the bias voltage set by the bias voltage setting unit when the plurality of light-emitting elements are switched off.

13. The light-emitting element driving device as claimed in claim 12, wherein the bias voltage setting unit calculates a plurality of voltage values and selects the voltage value of the bias voltage from the plurality of voltage values.

14. The light-emitting element driving device as claimed in claim 12, wherein the bias current supply unit sets the bias currents by performing negative feedback control to make each of the terminal voltages of the plurality of light-emitting elements coincides with the bias voltage set by the bias voltage setting unit.

15. The light-emitting element driving device as claimed in claim 12, wherein the setting of the bias voltage by the bias voltage setting unit and the setting of the bias currents by the bias current setting unit are performed at intervals of a predetermined cycle to thereby readjust the bias currents in accordance with voltage-current characteristic change of the plurality of light-emitting elements due to temperature change.

16. The light-emitting element driving device as claimed in claim 12, wherein a current source for the bias current supply unit serves also as a current source for the test current supply unit.

17. The light-emitting element driving device as claimed in claim 12, wherein the test current supply unit includes a unit common to the plurality of light-emitting elements for setting a current value of the test current.

* * * * *